US011788794B2

(12) United States Patent
Minamitani

(10) Patent No.: US 11,788,794 B2
(45) Date of Patent: *Oct. 17, 2023

(54) HEAT EXCHANGER AND INNER FIN THEREOF

(71) Applicant: RESONAC PACKAGING CORPORATION, Hikone (JP)

(72) Inventor: Koji Minamitani, Isehara (JP)

(73) Assignee: RESONAC PACKAGING CORPORATION, Hikone (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/133,631

(22) Filed: Dec. 24, 2020

(65) Prior Publication Data

US 2021/0199384 A1 Jul. 1, 2021

(30) Foreign Application Priority Data

Dec. 25, 2019 (JP) ................................ 2019-234834
Oct. 23, 2020 (JP) ................................ 2020-177751

(51) Int. Cl.
*F28D 9/00* (2006.01)
*F28F 3/06* (2006.01)
(Continued)

(52) U.S. Cl.
CPC .............. *F28D 9/0062* (2013.01); *F28F 3/06* (2013.01); *F28F 1/40* (2013.01); *F28F 2275/025* (2013.01); *H01L 23/473* (2013.01)

(58) Field of Classification Search
CPC ..... H01L 23/473; F28F 2275/025; F28F 1/40; F28D 9/0062
See application file for complete search history.

(56) References Cited

U.S. PATENT DOCUMENTS 4,089,324 A * 5/1978 Tjaden .................. F28D 9/0062 428/184
4,478,277 A 10/1984 Friedman et al.
(Continued)

FOREIGN PATENT DOCUMENTS

EP 2500682 9/2012
FR 3075340 6/2019
(Continued)

OTHER PUBLICATIONS

Translation of Japanese Patent Document JP2010080455A entitled Translation—JP2010080455A (Year: 2010).*
(Continued)

*Primary Examiner* — Paul Alvare
(74) *Attorney, Agent, or Firm* — MORI & WARD, LLP

(57) ABSTRACT

A heat exchanger having an outer packaging body having an inlet, an outlet, a pair of opposing walls, and a corrugated inner fin disposed between the opposing walls and provided alternately and continuously with a concave portion and a convex portion. The outer packaging body is formed of an outer packaging laminate material in which a resin heat-fusible layer is provided on an inner surface side of a metal heat transfer layer. The inner fin is formed of an inner core laminate material in which a heat-fusible layer is provided on both surface sides of a metal heat transfer layer. The inner fin has a rectangular wave shape in which a concave bottom wall and a convex top wall are arranged parallel to the opposing walls, and a rising wall connecting the concave bottom wall and the convex top wall is arranged perpendicular to the opposing walls.

15 Claims, 10 Drawing Sheets

(51) Int. Cl.
*H01L 23/473* (2006.01)
*F28F 1/40* (2006.01)

(56) References Cited

U.S. PATENT DOCUMENTS

| | | | | |
|---|---|---|---|---|
| 6,945,321 | B2 * | 9/2005 | Hosoya | F28D 1/0316 165/166 |
| 2002/0070007 | A1 * | 6/2002 | Calaman | H01L 23/473 257/E23.098 |
| 2005/0178533 | A1 * | 8/2005 | Minamitani | H01L 23/473 257/E23.098 |
| 2015/0260483 | A1 * | 9/2015 | Wibby | B32B 25/10 89/36.02 |
| 2015/0369545 | A1 * | 12/2015 | Naritomi | F28F 13/06 29/890.03 |
| 2016/0204394 | A1 | 7/2016 | Minamitani | |
| 2018/0259267 | A1 * | 9/2018 | Tsai | B23P 15/26 |
| 2019/0080985 | A1 * | 3/2019 | Higashiyama | H01L 23/473 |
| 2019/0279917 | A1 | 9/2019 | Gohara et al. | |
| 2021/0088292 | A1 * | 3/2021 | Crayssac | F28D 9/0062 |
| 2021/0138763 | A1 * | 5/2021 | Saito | B32B 15/20 |

FOREIGN PATENT DOCUMENTS

| | | | | |
|---|---|---|---|---|
| FR | 3075340 | A1 * | 6/2019 | B21D 53/02 |
| JP | 2000016908 | A * | 1/2000 | |
| JP | 2010080455 | A * | 4/2010 | H01L 23/473 |
| JP | 2015-059693 | | 3/2015 | |
| JP | 2015-141002 | | 8/2015 | |
| JP | 2016-189415 | | 11/2016 | |

OTHER PUBLICATIONS

Translation of Japanese Patent Document JP2000016908A entitled Translation—JP2000016908A (Year: 2000).*
Publication entitled, “Polyester Vs Polypropylene for Industrial Thread and Yarn”, Jay Todd (Year: 2014).*
Extended European Search Report for corresponding EP Application No. 20216384.6-1002, dated May 4, 2021.

* cited by examiner

HEAT EXCHANGER AND INNER FIN THEREOF

TECHNICAL FIELD

The present invention relates to a heat exchanger and an inner fin for the heat exchanger produced using a laminate material such as a laminate sheet in which a resin heat-fusible layer is laminated on a metal heat transfer layer.

BACKGROUND ART

With miniaturization and enhanced performance of electronic devices, such as, e.g., smartphones and personal computers, countermeasures for heat generation around a CPU of an electronic device have become crucial. A technique for avoiding the adverse effects of heat has been proposed in which some models incorporate a water-cooled cooler or a heat pipe to reduce a thermal load to an electronic component, such as, e.g., a CPU, so as not to build up heat inside the housing.

A battery module installed in an electric vehicle and a hybrid-vehicle increases heat generation from a battery pack due to the repeated charging and discharging. For this reason, in a battery module, in the same manner as in the above-described electronic devices, a technique has been proposed in which a water-cooled cooler or a heat pipe is incorporated to avoid the adverse thermal effects.

Further, in a power module made of silicon carbide (SiC) or the like, countermeasures have been proposed in which a cooling plate or a heat sink is assembled for the countermeasure for heat generation.

Incidentally, electronic devices, such as, e.g., smartphones and personal computers as described above, have a thin casing, and a large number of electronic components and a cooler are assembled in a limited space within the thin casing. Therefore, also as the cooler itself, a thin type will be used.

Conventionally, a thin type cooler, such as, e.g., a heat pipe to be incorporated into a small electronic device, is generally produced by joining a plurality of metal processed components obtained by processing metals with high thermal conductivity such as aluminum with brazing or diffusion bonding, etc. (see, for example, Patent Documents 1 to 3).

PRIOR ART DOCUMENT

Patent Document

Patent Document 1: Japanese Unexamined Patent Application Publication No. 2015-59693

Patent Document 2: Japanese Unexamined Patent Application Publication No. 2015-141002

Patent Document 3: Japanese Unexamined Patent Application Publication No. 2016-189415

SUMMARY OF THE INVENTION

Problems to be Solved by the Invention

In the above-described conventional cooler for a small electronic device, the constituent component is produced by metal processing (machining), such as, e.g., plastic working such as casting and forging, and removal processing such as cutting. However, since such metal processing is troublesome and severe in limitation, there is a limitation in thinning, and therefore there has been a problem that it is difficult to reduce the thickness beyond the current level.

Further, a conventional cooler for a small electronic device needs to be produced using a metal processing (metal-to-metal junction), such as, e.g., brazing and diffusion bonding, which is high in difficulty, when joining the constituent components. Therefore, the production is troublesome. Besides, the production efficiency is low, resulting in an increased cost.

Furthermore, since a conventional cooler is produced using metal processing with limitations, the shape and the size cannot be easily changed. Thus, the design freedom is poor, and the resulting product lacks versatility.

Preferred embodiments of the present invention have been made in view of the above-described and/or other problems in the related art. Preferred embodiments of the present invention can significantly improve upon existing methods and/or devices.

The present invention has been made in view of the above problems. An object of the present invention is to provide a heat exchanger and an inner fin for a heat exchanger capable of achieving a sufficient reduction in thickness and a high degree of freedom in design versatility, and capable of being efficiently and easily produced to attain a cost reduction.

Other objects and advantages of the present invention will be apparent from the following preferred embodiments.

Means for Solving the Problem

In order to solve the above-described problems, the present invention provides the following means.

[1] A heat exchanger comprising:

an outer packaging body provided with an inlet, an outlet, and a pair of opposing walls; and a corrugated inner fin disposed between the pair of opposing walls and provided with a concave portion and a convex portion alternately and continuously, wherein a heat exchange medium flows into an inner fin installation portion in the outer packaging body from the inlet, passes through the inner fin installation portion, and flows out of the outlet, wherein the outer packaging body is formed of an outer packaging laminate material in which a resin heat-fusible layer is provided on an inner surface side of a metal heat transfer layer, wherein the inner fin is formed of an inner core laminate material in which a heat-fusible layer is provided on both surface sides of a metal heat transfer layer, wherein the inner fin is formed in a rectangular wave shape in which a concave bottom wall and a convex top wall are arranged parallel to the pair of opposing walls, and a rising wall connecting the concave bottom wall and the convex top wall is arranged perpendicular to the pair of opposing walls, and wherein the concave bottom wall and the convex top wall of the inner fin and the pair of opposing walls of the outer packaging body are joined.

[2] The heat exchanger as recited in the above-described Item [1], wherein when a width of the concave bottom wall of the inner fin is W11, and a width of the convex top wall is W12, the following relation is satisfied:

$$0.9 \leq W12/W11 \leq 1.1$$

[3] The heat exchanger as recited in the above-described Item [1] or [2], wherein when a fin pitch of the inner fin is Pf, and a fin height of the inner fin is Hf, the following relation is satisfied:

$$Pf/2=0.1Hf \text{ to } 10Hf$$

[4] The heat exchanger as recited in any one of the above-described Items [1] to [3], wherein the outer packaging body is composed of a tray member having a recessed portion formed in an intermediate region for accommodating the inner fin, and a cover member arranged to close the recessed portion of the tray member.

[5] The heat exchanger as recited in any one of the above-described Items [1] to [3], wherein the outer packaging body is formed by integrally joining outer peripheral edge portions of two outer packaging laminate materials stacked via the inner fin.

[6] An inner fin for use in a heat exchanger, the heat exchanger being composed of an outer packaging body including an inlet, an outlet, a pair of opposing walls and configured such that a heat exchange medium flows into the outer packaging body from the inlet, passes through the outer packaging body, and flows out of the outlet, wherein the inner fin is configured to be disposed between the pair of opposing walls, wherein the inner fin is formed of an inner core laminate material in which a heat-fusible layer is provided on both surface sides of a metal heat transfer layer, wherein the inner fin is formed in a rectangular wave shape in which a concave portion and a convex portion are alternately and continuously provided, a concave bottom wall of the inner fin and a convex top wall of the inner fin are arranged parallel to the pair of opposing walls, and a rising wall connecting the concave bottom wall and the convex top wall is arranged perpendicular to the pair of opposing walls, and wherein the concave bottom wall and the convex top wall of the inner fin and the pair of opposing walls of the outer packaging body are joined.

Effects of the Invention

According to the heat exchanger of the invention of the above-described Item [1], since the inner fin is formed in a rectangular wave shape, a number of rising walls each connecting between the concave bottom wall and the convex top wall are arranged in a state in which they are perpendicular to the pair of opposing walls of the outer packaging body. Therefore, the inner fin can fully exert its function as a reinforcing member, ensuring high strength. Therefore, it is possible to stabilize the shape against external pressure and internal pressure, which in turn can improve the operational reliability and the heat exchanging performance.

Further, in the heat exchanger of the present invention, it is produced by heat-fusing laminate materials or the like. Therefore, there is no need to use a troublesome metal processing, which makes it possible to efficiently and simply produce it and reduce the production cost and also possible to sufficiently attain the reduction of the thickness. Furthermore, in the heat exchanger of the present invention, the laminate material served as the outer packaging body or the inner fin can be easily changed in the shape and size. This allows more flexibility in designing and improves versatility.

According to the heat exchanger of the invention as recited in the above-described Item [2], the junction area for each of the pair of opposing walls of the inner fin (both side walls) is approximately equal. Therefore, it is possible to receive the external pressure and the internal pressure by equally dispersing the pressures in both side walls in a well-balanced manner. As a result, it is possible to assuredly prevent problems, such as, e.g., deformations of the heat exchanger due to external pressure and internal pressure.

According to the heat exchanger of the invention [3], the fin pitch is set to a particular value with respect to the fin height. Therefore, it is possible to ensure enough strength against internal pressure and external pressure while improving the fluidity of the heat exchange medium, which in turn can further improve the operational reliability and the heat exchanging performance.

According to the heat exchanger of the inventions as recited in the above-described Items [4] and [5], the above-described effects can be obtained more assuredly.

According to the inner fin for a heat exchanger of the invention as recited in the above-described Item [6], since the inner fin is formed in a rectangular wave shape, it is possible to assuredly produce a heat exchanger capable of achieving the same effects as those of the heat exchanger of the above-described inventions by producing the heat exchanger using the inner fin.

BRIEF DESCRIPTION OF THE DRAWINGS

FIG. 2A is a plan view thereof. FIG. 2B is a side cross-sectional view corresponding to the line B-B cross-section of FIG. 2A. FIG. 2C is a front cross-sectional view corresponding to the line C-C cross-section of FIG. 2A.

FIG. 6A is a plan view thereof, and FIG. 6B is a side cross-sectional view corresponding to the B-B cross-section of FIG. 6A.

FIG. 10A is a plan view thereof. FIG. 10B is a side cross-sectional view corresponding to the line B-B cross-section of FIG. 10A. FIG. 10C is a front cross-sectional view corresponding to the line C-C cross-section of FIG. 10A.

FIG. 11A is a plan view thereof. FIG. 11B is a side cross-sectional view corresponding to the line B-B cross-section of FIG. 11A, FIG. 11C is a front cross-sectional view corresponding to the line C-C cross-section of FIG. 11A.

EMBODIMENTS FOR CARRYING OUT THE INVENTION

The heat exchanger of the present invention is mainly used as a cooler for cooling a vehicle-mounted battery and has a configuration that can withstand external pressure even when large pressure is applied from the outside.

FIRST EMBODIMENT

Figure 1:
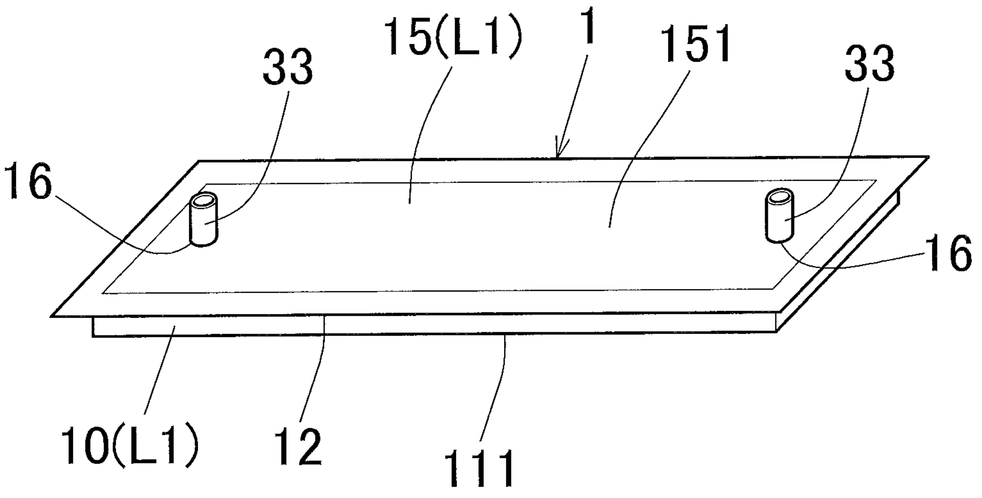
FIG. 1 is a perspective view showing a heat exchanger of the present invention.
Figure 2C:
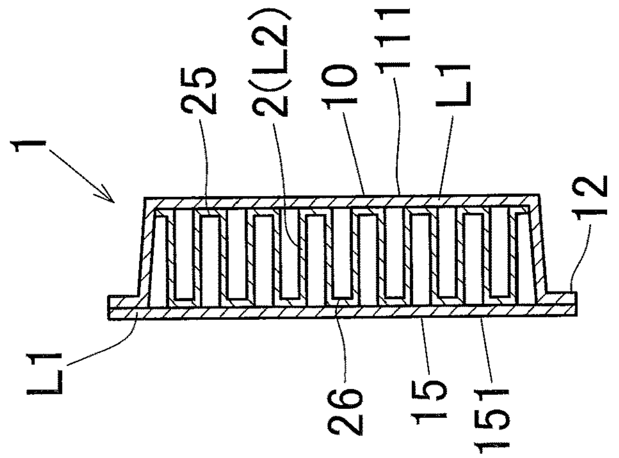
FIGS. 2A to 2C are diagrams showing a heat exchanger of the first embodiment.
Figure 2A:
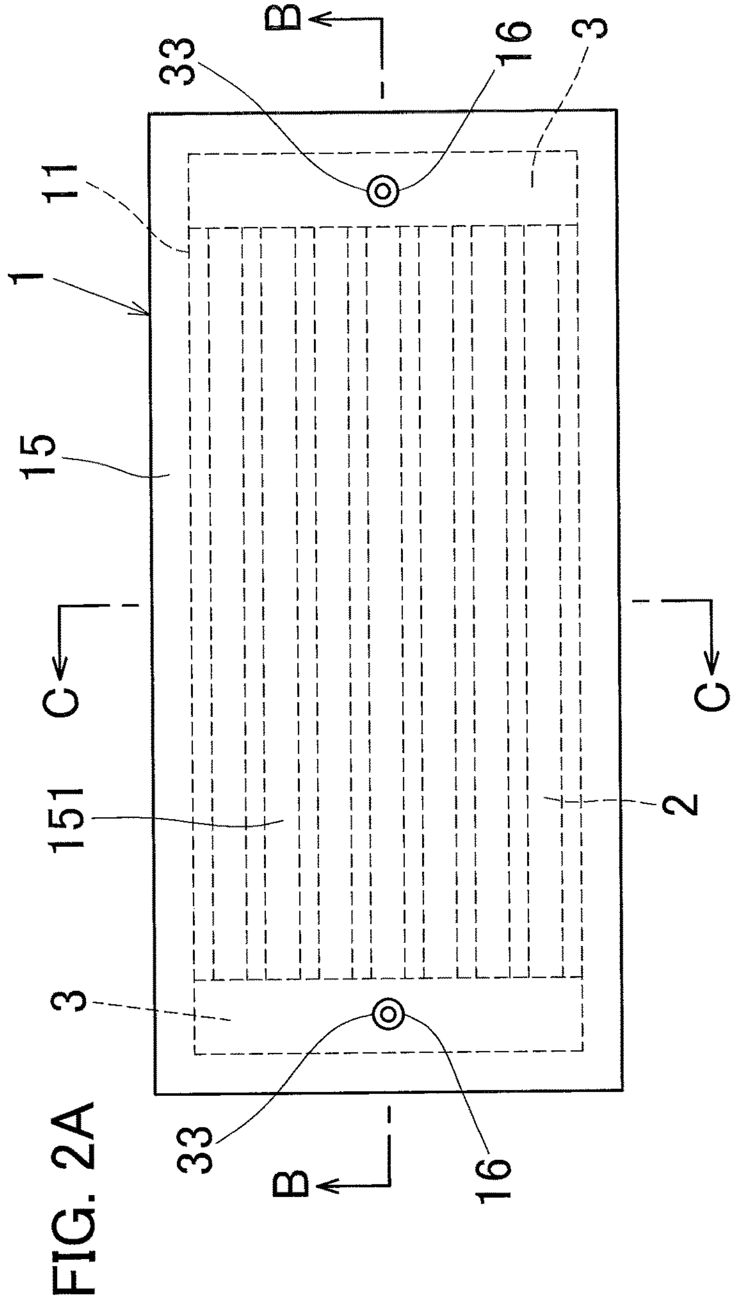
Figure 2B:
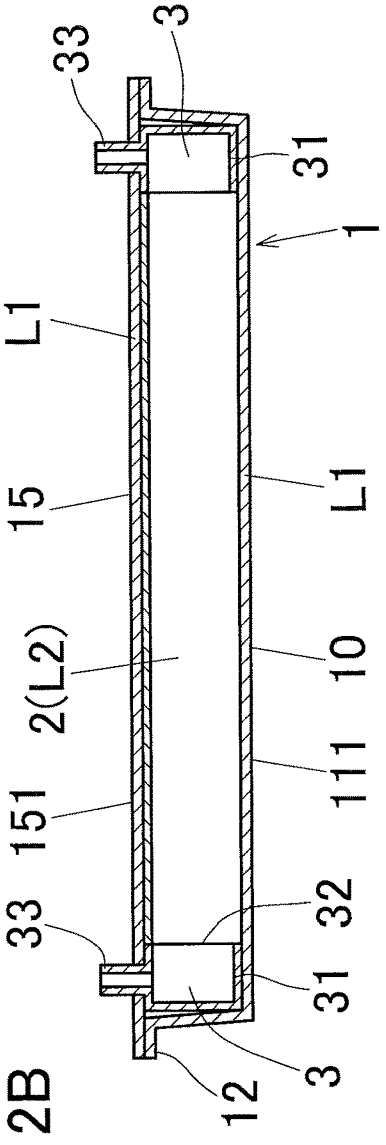
Figure 3:
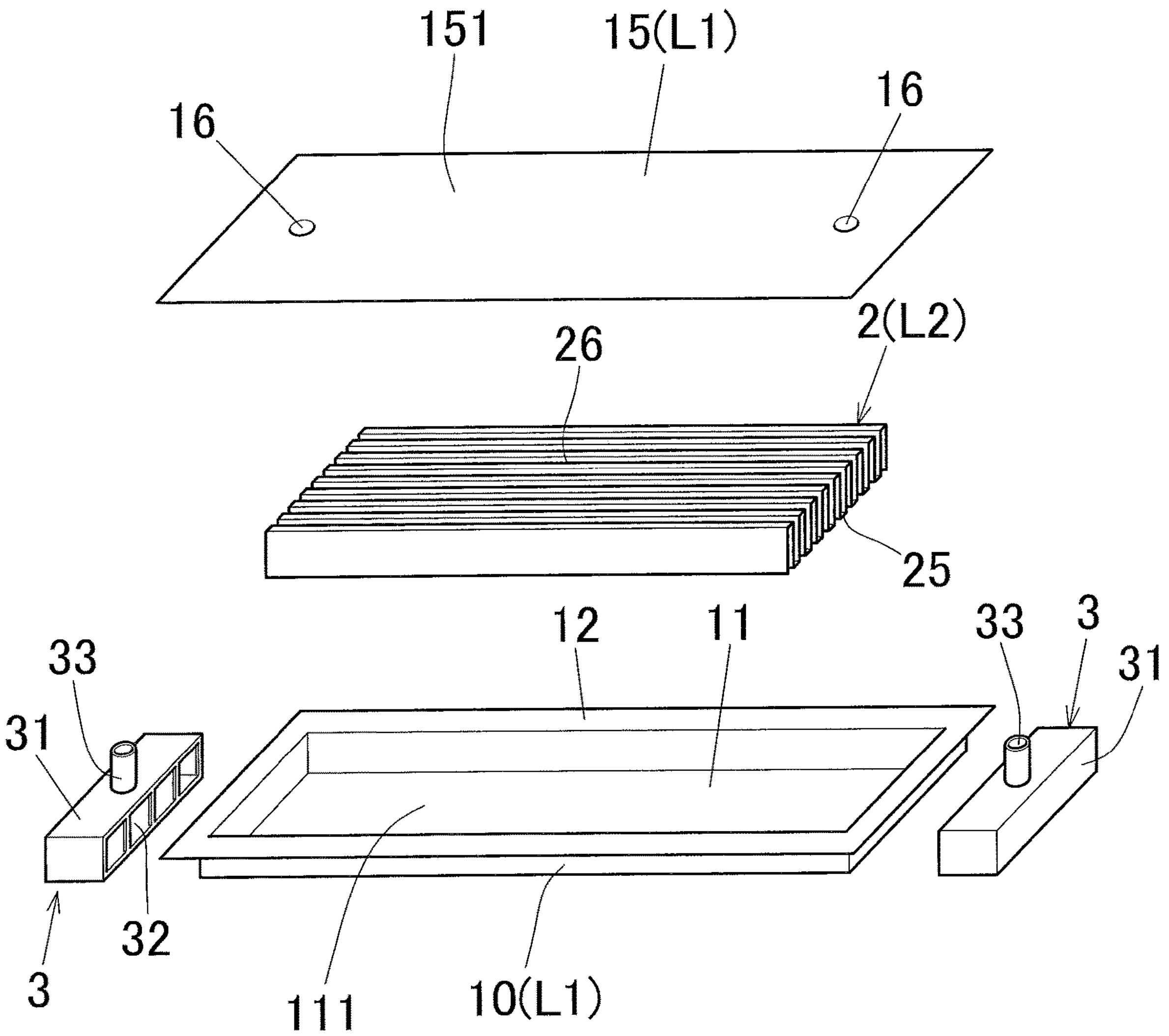
FIG. 3 is an exploded perspective view of a heat exchanger of a first embodiment.

FIGS. 1 to 3 are diagrams showing a heat exchanger of a first embodiment. In the following descriptions, in order to facilitate understanding of the present invention, the left-right direction (longitudinal direction) of FIG. 2A is defined as a "front-back direction", the vertical direction with respect to the front-back direction on the paper surface of FIG. 2A is defined as a "width direction", and the up-down direction of FIG. 2B is defined as an "up-down direction (thickness direction)".

As shown in FIGS. 1 to 3, the heat exchanger of the first embodiment is used as a heat transfer panel, a heat transfer tube, or the like. The heat exchanger is provided with an outer packaging body 1 as a casing (container), an inner fin (inner core material) 2 housed inside the outer packaging body 1, and a pair of (both sides) headers (joint members) 3 and 3 housed at both ends in the outer packaging body 1.

The outer packaging body 1 is composed of a tray member 10 of a rectangular shape in a plan view and a cover member 15 of a rectangular shape in a plan view.

The tray member 10 is composed of a molded article of an outer packaging laminate material L1. In the tray member 10, the entire intermediate region except for the outer peripheral edge portion is recessed downwardly by cold forming, such as, e.g., deep drawing and extrusion, to form a recessed portion 11 having a rectangular shape in a plan view. Further, a flange portion 12 projecting outward is integrally formed on the outer periphery of the opening edge portion of the recessed portion 11.

Further, in the cover member 15, a pair of an inlet 16 and an outlet 16 corresponding to the front and rear ends of the recessed portion 11 in the tray member 10 are formed. Needless to say, in this embodiment, one of the pair of the inlet 16 and the outlet 16 is configured as an inlet, and the other of the pair of the inlet 16 and the outlet 16 is configured as an outlet.

The tray member 10 and the cover member 15 each are composed of an outer packaging laminate material L1 which is a laminate sheet having flexibility and bendability.

Figure 4:
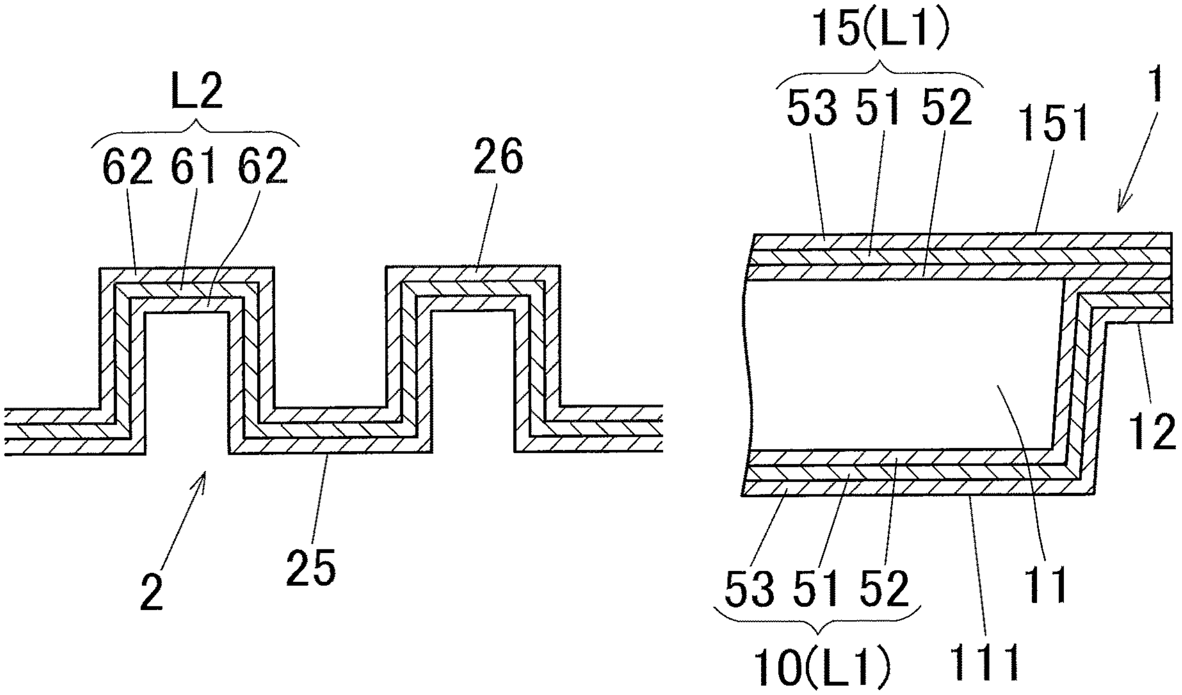
FIG. 4 is a front cross-sectional view for explaining an outer packaging body and an inner fin applied to the heat exchanger of the first embodiment.

As shown in FIG. 4, the outer packaging laminate material L1 is composed of a metal (metal foil) heat transfer layer 51, a heat-fusible layer 52 made of a heat-fusible resin film or a heat-fusible resin sheet laminated on one surface (inner surface) of the heat transfer layer 51 via an adhesive agent, and a protective layer 53 made of a heat resistant resin film or a heat resistant resin sheet laminated on the other surface (outer surface) of the heat transfer layer 51 via an adhesive agent. Note that in this embodiment, the term "foil" is used to include the meaning of a film, a thin plate, and a sheet.

As the heat transfer layer 51 in the outer packaging laminate material L1, a copper foil, an aluminum foil, a stainless-steel foil, a nickel foil, a nickel-plated copper foil, a clad metal made of a nickel foil and a copper foil, or the like, can be suitably used. Among these, an aluminum foil is preferably used in view of costs and thermal conductivity.

Among aluminum foils, it is preferable to use pure aluminum, an Al—Mn based alloy containing Mn: 1.0% to 1.5%, or an Al—Fe based alloy containing Fe: 0.7% to 1.7%. Among these, it is particularly preferable to use an Al—Fe based alloy containing Fe: 0.7% to 1.7% in view of formability and durability to external pressure and internal pressure.

Note that in this embodiment, the terms "copper," "aluminum," "nickel," and "titanium" are used in the meaning that they also include alloys thereof.

The heat transfer layer 51 is also called a heat collecting layer. As the heat transfer layer 51, it is preferable to use a layer having a thickness of 8 μm to 300 μm, and more preferably 100 μm or less.

By being subjected to a surface treatment, such as, e.g., a chemical conversion treatment, the heat transfer layer 51 can be improved in the corrosion resistance and the adhesiveness to a resin, which can further improve the durability.

As the chemical conversion treatment, the following treatment can be exemplified. That is, a surface of a metal foil subjected to a degreasing treatment is coated with any one of 1) to 3) aqueous solutions described below, and then dried to be subjected to a chemical conversion treatment.

1) An aqueous solution of a mixture containing at least one compound selected from the group consisting of phosphoric acid, chromic acid, a metal salt of fluoride, and a non-metal salt of fluoride 2) An aqueous solution of a mixture containing at least one kind of resin selected from the group consisting of chromic acid, an acrylic resin, a chitosan derivative resin, and a phenolic resin, and at least one kind of compound selected from the group consisting of chromic acid and chromium (III) salt 3) an aqueous solution of a mixture containing at least one kind of resin selected from the group consisting of phosphoric acid, an acrylic resin, a chitosan derivative resin, and a phenolic resin, at least one kind of compound selected from the group consisting of chromic acid and chromium (III) salt, and at least one kind of compound selected from the group consisting of a metal salt of fluoride and a non-metal salt of fluoride The above-described chemical conversion coating is preferably set to 0.1 $mg/m^2$ to 50 $mg/m^2$, more preferably 2 $mg/m^2$ to 20 $mg/m^2$ as the amount of chromium adhesion amount (per one side).

As the heat-fusible layer 52, a film or a sheet made of a polyolefin-based resin, such as, e.g., polyethylene and polypropylene, or a modified resin thereof, a fluorine-based resin, a polyester-based resin, a vinyl chloride resin, or the like, can be suitably used. Among them, it is preferable to use a film or a sheet made of non-stretched polypropylene (CPP) or linear low-density polyethylene (LLDPE).

Note that as the heat-fusible layer 52, it is preferable to use a heat-fusible layer having a thickness of 20 μm to 5,000 μm, more preferably 30 μm to 80 μm.

Further, as the protective layer 53, a film or a sheet made of a polyester resin (PEs), a polyamide resin (PA), or the like, which is a heat resistant resin, can be suitably used.

Here, as the heat resistant resin constituting the protective layer 53, a heat resistant resin which is melted by heating temperatures at the time of the thermal fusion treatment of the outer packaging body 1, the inner fin 2, or the like, is used. As this heat resistant resin, it is preferable to use a heat resistant resin having a melting point higher than the melting point of the heat-fusibility resin by 10° C. or more. It is particularly preferable to use a heat resistant resin having a melting point higher than the melting point of the heat-fusibility resin by 20° C. or more.

Further, as the protective layer 53, it is preferable to use a protective layer having a thickness of 6 μm to 100 μm.

Further, as the adhesive agent for bonding between the heat transfer layer 51, the heat-fusible layer 52, and the protective layer 53 constituting the outer packaging laminate material L1, a urethane-based adhesive agent, an epoxy-based adhesive agent, an olefin-based adhesive agent, or the like, having a thickness of 1 μm to 5 μm can be suitably used.

In this embodiment, a sheet of a three-layer structure is used as the laminate material L1 constituting the outer packaging body 1, but the present invention is not limited thereto. In the present invention, a sheet of a four or more layer structure may be used. For example, another layer may be interposed between the protective layer and the heat transfer layer, or another layer may be interposed between the heat transfer layer and the heat-fusible layer, so that a four or more layer structure may be employed.

The tray member 10 and the cover member 15 of the outer packaging body 1 are constituted by the outer packaging laminate material L1 having the above-described configuration. As will be described later in detail, the cover member 15 is attached to the tray member 10 so as to close the opening of the recessed portion 11, thereby forming the outer packaging body 1.

In this embodiment, a pair of opposing walls is configured by the bottom wall (lower wall) 111 of the recessed portion 11 of the tray member 10 and a portion (upper wall) 151 of the top wall of the cover member 15 attached to the tray member 10 corresponding to the recessed portion 11.

As shown in FIGS. 1 to 4, the inner fin 2 accommodated in the hollow portion (recessed portion 11) of the outer packaging body 1 is constituted by an inner core laminate material L2 which is a laminate sheet having flexibility or bendability.

As shown in FIG. 4, the inner core laminate material L2 includes a heat transfer layer 61 formed of a metal foil and heat-fusible layers 62 and 62 each formed of a resin film or a resin sheet laminated on both surfaces of the heat transfer layer 61 via an adhesive agent.

As the heat transfer layer 61 in the inner core laminate material L2, a copper foil, an aluminum foil, a stainless-steel foil, a nickel foil, a nickel-plated copper foil, a cladding metal formed of a nickel foil and a copper foil, or the like, can be suitably used. Among these, an aluminum foil is preferably used in view of cost and thermal conductivity.

Among aluminum foils, a pure aluminum, an Al—Mn based alloy containing 1.0% to 1.5% of Mn, or an Al—Fe based alloy containing 0.7% to 1.7% of Fe is preferably used. Among these, in view of formability and durability to internal pressure and external pressure, it is particularly preferable to use an Al—Fe based alloy containing 0.7% to 1.7% of Fe.

As the heat transfer layer 61, it is preferable to use a heat transfer layer having a thickness of 8 μm to 300 μm, more preferably 100 μm or less.

As the heat-fusible layer 62, a film or a sheet configured by a polyolefin-based resin, such as, e.g., polyethylene or polypropylene or a modified resin thereof, a fluorine-based resin, a polyester-based resin, a vinyl chloride resin, or the like, can be suitably used. Among them, it is preferable to use a film or a sheet configured by non-stretched polypropylene (CPP) or linear low-densipolyethylene (LLDPE).

As the heat-fusible layer 62, it is preferable to use a heat-fusible layer having a thickness of 20 μm to 5,000 μm, more preferably 30 μm to 80 μm.

Further, as the adhesive agent for bonding between the heat transfer layer 61 and the heat-fusible layer 62 constituting the inner core laminate material L2, as in the case of the above-described outer packaging laminate material L1, a urethane-based adhesive agent, an epoxy-based adhesive agent, an olefin-based adhesive agent, or the like, having a thickness of 1 μm to 5 μm can be suitably used.

Note that in this embodiment, as the laminate material L2 constituting the inner fin 2, a three-layer structure sheet is used, but the present invention is not limited thereto. In the present invention, and a four or more layer structure sheet may be used. For example, a four or more layer structure sheet in which another layer is interposed between the heat-fusible layer and the heat transfer layer may be employed.

As the processing method of the inner fin 2, in addition to cutting, injection molding, and sheet forming (vacuum forming, pressure forming, etc.), corrugating or embossing may be employed. Needless to say, the processing method of the inner fin 2 is not specifically limited.

As shown in FIGS. 2 to 5, the inner fin 2 is formed in a rectangular wave shape (square wave shape) or a so-called digital signal waveform in which a concave portion 25 and a convex portion 26 are formed alternately and continuously. That is, the concave bottom surface (lower wall) and the convex portion top surface (top wall) of the inner fin 2 of this embodiment are each formed flat and arranged, in a heat exchanger assembled state, parallel to the bottom wall (lower wall) 111 of the tray member 10 and the top wall (upper wall) 151 of the cover member 15. Additionally, in the inner fin 2, the rising wall connecting the concave bottom wall and the convex top wall adjacent to each other is arranged to be perpendicular to the concave bottom wall and the convex top wall, or to the lower wall 111 and the upper wall 151 of the outer packaging body 1 in the heat exchanger assembled state.

In this embodiment, in the inner fin 2, the distance from the centerline of one concave portion 25 (one convex portion 26) to the centerline of the other concave portion 25 (the other convex portion 26) is defined as a fin pitch Pf in the adjacent concave portions 25 and 25 (or adjacent convex portions 26 and 26), and the distance from the centerline of the concave portion 25 to the centerline of the convex portion 26 is defined as a half-pitch (Pf/2) in the adjacent concave and convex portions 25 and 26. The fin pitch Pf and the half-pitch Pf/2 are arranged at equal pitches.

Figure 5:
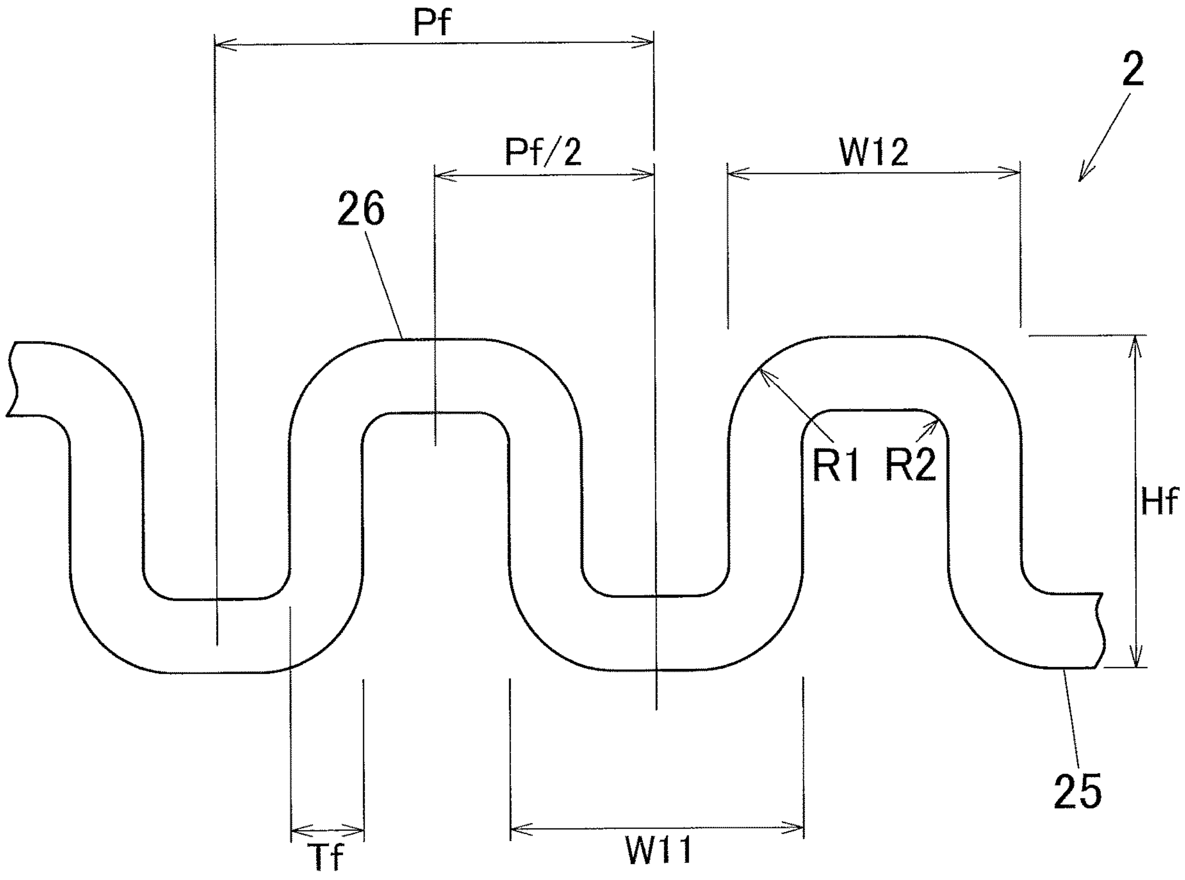
FIG. 5 is a front cross-sectional view for explaining the inner fin of the first embodiment.

In other words, the width dimension of the concave bottom wall (the width dimension in the left-right direction toward the paper surface in FIG. 5) W11 and the width direction of the W12 of the convex top wall are set equal. In the present invention, the fin pitch P and the half-pitch Pf/2 need not necessarily be set to equal pitches. The pitch interval may be differentiated. The width W11 of each concave bottom wall may be different from each other. The width W12 of each convex top wall may be different from each other. Further, the width W11 of the concave bottom wall may be different from the width W12 of the convex top wall 26. In short, the inner fin 2 of the present invention may be of any shape as long as it is a rectangular wave shape.

In this embodiment, the half-pitch Pf/2 is preferably set to 1 mm to 5 mm. That is, when the half-pitch Pf/2 is too narrow, the processing becomes difficult and the pressure-loss of a heat exchange medium increases, which is not undesirable. Conversely, when the half-pitch Pf/2 is too wide, it becomes easily deformed by external pressure, which may result in deteriorated pressure resistance, which is undesirable.

Further, in this embodiment, it is preferable to set the half-pitch Pf/2 to 0.1 times to 10 times the fin height Hf. That is, it is preferable to satisfy the relationship of $0.1Hf \leq Pf/2 \leq 10Hf$. When the fin pitch (half-pitch) is set to a specified value as described above, it is possible to secure sufficient strength against both the internal pressure and the external pressure while securing the good fluidity of the heat exchange medium, which in turn can improve the operational reliability and the heat exchanging performance.

In this embodiment, the ratio W12/W11 of the width W12 of the convex portion top wall to the width W11 of the concave bottom wall is preferably set to 0.9 to 1.1. That is, it is preferable to satisfy the relationship of $0.9 \leq W12/W11 \leq 1.1$. When this relationship is satisfied, the junction area between the inner fin 2 and the lower wall 111 and the junction area between the inner fin 2 and the upper wall 151 become substantially equal. This enables to evenly disperse the external pressure and the internal pressure on both the upper and lower sides and receive the pressure in a balanced manner. Therefore, it is possible to assuredly prevent problems, such as, a deformation of the heat exchanger due to external pressure and internal pressure.

Further, in this embodiment, it is preferable to set the fin height Hf of the inner fin 2 to 0.1 mm to 50 mm.

As for a fin thickness Tf, it is preferably set to 0.1 mm to 2 mm. This is because when the fin thickness Tf is too thin, the intensity against external pressure deteriorates, on the other hand, when the fin thickness Tf is too thick, it may adversely affect the heat transfer and the flow rate of the heat medium.

Further, in the inner fin 2 of this embodiment, from the viewpoint of a production method or the like, it is preferable to set the outer corner radius (outer radius of curvature) R1 at the corner portion between the convex top wall (or concave bottom wall) and the rising wall to 0.2 mm to 7 mm, and the inner corner radius (inner radius of curvature) R2 to 0.1 mm to 1 mm.

The inner fin 2 is accommodated in the recessed portion 11 of the tray member 10. In this case, the inner fin 2 is accommodated in the intermediate portion of the recessed portion 11 of the tray member 10 except for both front and rear ends. Furthermore, the inner fin 2 is arranged such that its ridge direction and the valley direction coincide with the front-back direction (left-right direction in FIG. 1) of the tray member 10. Thus, the tunnel portions and the groove portions formed by the ridges and the valleys of the inner fin 2 are configured as heat exchange flow passages.

The plurality of heat exchange flow passages is arranged in the front-back direction (length direction) of the tray member 10 and arranged in parallel in the width direction (left-right direction). The heat exchange medium (heat transfer medium) is configured to smoothly flow through each heat exchange flow passage from one end side of the outer packaging body 1 in the front-back direction to the other end side in an evenly dispersed manner.

On the other hand, as shown in FIG. 2 and FIG. 3, the pair of headers 3 and 3 disposed at both ends of the outer packaging body 1 is formed of a molded product of a synthetic resin.

As the resin constituting the header 3, it is preferable to use the same kind of resin as the resin constituting the heat-fusible layer 52, 62 of the outer packaging body 1 and the inner fin 2 described above. Specifically, a polyolefin-based resin, such as, polyethylene, polypropylene, and a modified resin, a fluorine-based resin, a polyester-based resin, a vinyl chloride resin, or the like, can be suitably used.

The header 3 is provided with a box-shaped mounting box portion 31 having an opening 32 on one side surface, and a pipe portion 33 provided on the upper wall of the mounting box portion 31. The pipe portion 33 is communicated with the inside of the mounting box portion 31, and is configured so that the heat exchange medium can pass between the inside of the pipe portion 33 and the inside of the mounting box portion 31.

The mounting box portion 31 of the header 3 is disposed on both sides of the inner fin 2 in the recessed portion 11 of the tray member 10. Further, the pipe portion 33 of the header 3 is disposed upward, and the opening 32 of the mounting box portion 31 is disposed toward the inside, i.e., opposed to the inner fin 2.

Thus, the headers 3 and 3 are accommodated in the tray member 10, and then the cover member 15 is arranged on the tray member 10 so as to close its opening. At this time, the upwardly extruding pipe portions 33 and 33 of the headers 3 and 3 are inserted into the inlet 16 and the outlet 16 of the cover member 15.

Then, the temporarily assembled heat exchanger preassembled product is heated, so that the members in contact with each other are heat-fused to be integrally joined with each other.

First, the overlapping portions of the flange portion 12 of the tray member 10 and the outer peripheral edge portion of the cover member 15 in the outer packaging body 1 are heated while being sandwiched by a pair of upper and lower heat-sealing dies (Outer Packaging Body Fusing Process). With this, the heat-fusible layer 52 of the flange portion 12 of the tray member 10 and the heat-fusible layer 52 of the outer peripheral edge portion of the cover member 15 are heat-fused (heat-bonded) to seal the hollow portion of the outer packaging body 1 in a liquid-tight state or in an airtight state.

Subsequently, the intermediate region (the lower wall 111 and upper wall 151) of the outer packaging body 1 in which the outer peripheral edge portion has been heat-bonded is heated while being sandwiched between a pair of upper and lower heating plates. Thus, the heat-fusible layer 62 of the ridge portion and the valley bottom portion of the inner fin 2 and the heat-fusible layer 52 of the intermediate region (upper wall) 151 of the bottom wall 111 of the tray member 10 and the cover member 15 are integrally secured by thermal welding (heat-bonding) to seal in a liquid-tight or in an airtight manner (Fin Heat-fusing Step). Further in this fin heat-fusing step, the outer peripheral surfaces of the mounting box portions 31 and 31 of the headers 3 and 3, and the heat-fusible layers 52 of the tray member 10, and the heat-fusible layers 52 of the cover member 15 are integrally joined by thermal welding (heat-bonding) to seal in a liquid-tight or in an airtight manner.

In the heat exchanger assembled as described above, the pipe portions 33 and 33 of the headers 3 and 3 are arranged so as to protrude upward from the upper wall (cover member 15) at both ends of the outer packaging body 1.

In cases where the inner fin 2, the headers 3 and 3, and the outer packaging body 1 are formed of the same kind of resins, they can be securely fixed to each other with satisfactory mounting strength.

Note that in this embodiment, the heat fusion processing (heating processing) is performed under reduced pressure. With this, the heat fusion bonding can be assuredly performed with a high adhesion state between the tray member 10, the cover member 15, the inner fin 2, and the headers 3 and 3 in contact with the tray member 10 and the cover member 15, which can secure a wide bonding area. Therefore, it is preferable to perform the heat fusion processing under reduced pressure.

In this embodiment, the heating temperature at the time of the thermal fusion processing is preferably set to 140° C. to 250° C., and more preferably to 160° C. to 200° C. Further, the pressure (bonding pressure) at the time of the heat fusion is preferably set to 0.1 MPa to 0.5 MPa, more preferably to 0.15 MPa to 0.4 MPa. Further, the fusing time (bonding time) is preferably set to 2 seconds to 10 seconds, more preferably 3 seconds to 7 seconds.

Further, in this embodiment, the outer cover member heat-fusing step for heat-fusing the flange portion 12 of the tray member 10 and the outer peripheral edge portion of the cover member 15, and the fin heat-fusing step for heat-fusing the inner fin 2, the headers 3 and 3, and the outer packaging body are performed by separate heat processing, but the present invention is not limited thereto. In the present invention, the outer packaging body heat-fusing step and the fin heat-fusing step may be performed by the same heat processing.

In this embodiment, in the heat-fusing step, particularly in the fin heat-fusing step, a thermally conductive rubber layer is disposed at each of the contact surfaces of the pair of heating plates which come into contact with the lower wall 111 and the upper wall 151 of the outer packaging body 1 when sandwiching the outer packaging body 1. With this, it is possible to assuredly bring the lower wall 111 and the upper wall 151 of the outer packaging body 1 into contact with the concave bottom surface and the convex top surface of the inner fin 2. Thus, the heat-fusing step can be performed with high accuracy.

The heat exchanger having the above-described configuration is used as a cooler (cooling device) for cooling batteries or the like as a cooling target member (heat exchange target member). An inflow pipe for introducing a cooling fluid (cooling water, antifreeze, etc.) as a heat exchange medium (coolant) is connected to one of the pipe portions 33 of the heat exchanger, and an outlet pipe for discharging the cooling fluid is connected to the other pipe portion 33. In addition, a battery as a cooling target member is placed in a state in which the battery is in contact with the lower wall 111 and/or the upper wall 151 of the outer packaging body 1 of the heat exchanger.

Then, in this state, a cooling fluid is introduced to the inside of the outer packaging body 1 from one of the pipe portions 33 through one of the headers 3 to flow through the portion provided with the inner fin 2 to flow out of the other pipe portion 33. Thus, by circulating the cooling fluid through the outer packaging body 1, heat is exchanged between the cooling fluid and the battery via the upper and lower walls of the inner fin 2 and the outer packaging body 1. Thus, the battery is cooled.

The application mode of the heat exchanger of this embodiment is not particularly limited. For example, only one heat exchanger or two or more heat exchangers can be used. As described above, in the case of using a single heat exchanger, the heat exchanger is used in a state in which a heat exchanger target member is brought into contact with each of the top and bottom surfaces of the heat exchanger. In the case of using two heat exchangers, for example, it may be used by placing so as to sandwich a heat exchange target member by two heat exchangers. In the case of using more than two heat exchanges, the heat exchanger and the heat exchange target member may be alternatively stacked.

As described above, according to the heat exchanger of this first embodiment, since the inner fin 2 is formed in the rectangular wave shape, the contact area between the inner fin 2 and the outer packaging body 1 can be sufficiently secured. Thus, the heat exchange efficiency between the outer packaging body 1 and the cooling target member which is brought into contact with the outer surface of the outer packaging body 1 can be improved, which in turn can obtain a high heat exchanging performance. Further, since a large contact area between the inner fin 2 and the outer packaging body 1 can be ensured, the mounting strength of the inner fin 2 to the outer packaging body 1 can be improved. Therefore, occurrence of a contact defect or the like can be assuredly prevented.

Further, since the inner fin 2 is formed in the rectangular wave shape, a number of rising walls each connecting between the concave bottom wall and the convex top wall are arranged in a state of being perpendicular to the facing upper and lower walls 111 and 151 of the outer packaging body 1. Therefore, the inner fin 2 can sufficiently exhibit the function as a reinforcing member, and for example, acts to thrust against the stress in the compressive direction due to external pressure and acts to pull against the stress in the expansion direction due to internal pressure. Therefore, high strength can be ensured against any pressure of internal pressure and external pressure, which can prevent deformation to assuredly maintain the shape in a stable manner. Thus, it is possible to further improve the operational reliability.

In particular, in cases where a plurality of heat exchangers is used in a stacked manner, it is possible to ensure adequate pressure resistance, thereby capable of assuredly maintaining a stable form (shape), which in turn can assuredly obtain a high heat exchanging performance. Furthermore, since the sufficient pressure resistance can be ensured, there is no need to provide a reinforcing member separately. Therefore, the number of components can be reduced accordingly to thereby simplify the construction and reduce the cost.

Figure 9:
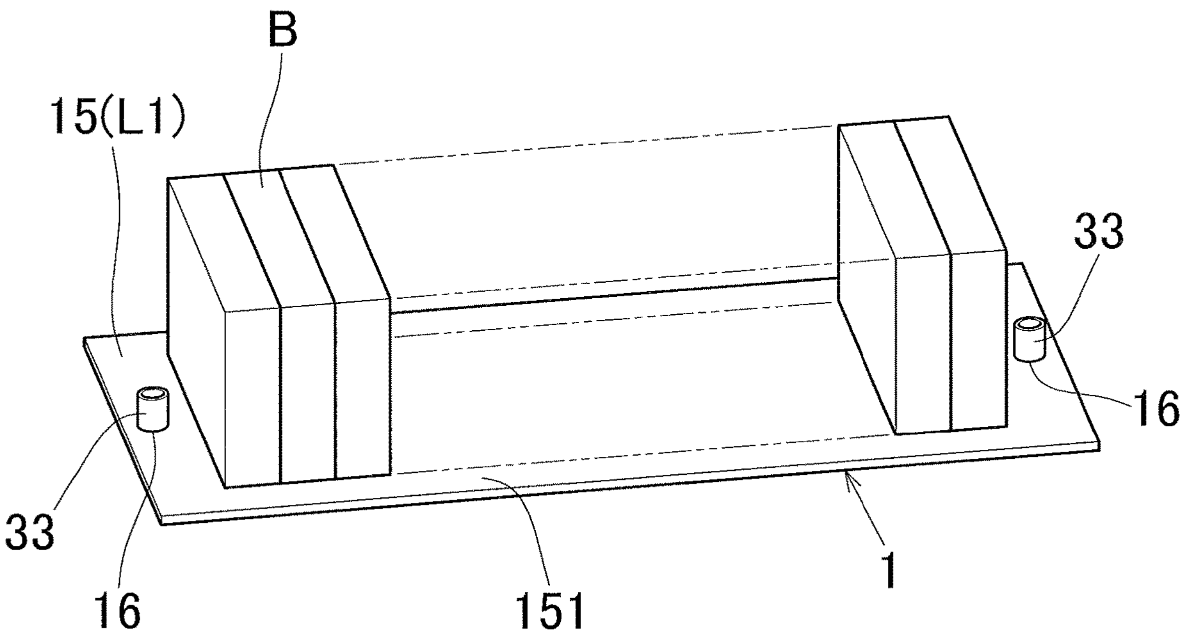
FIG. 9 is a perspective view showing a state in which batteries are mounted on a heat exchanger of the present invention.

Further, in this embodiment, as shown in FIG. 9, a battery pack composed of a number of batteries B is placed on the upper surface of the cover member 15 of the heat exchanger. Thus, the total weight of the batteries B constituting the battery pack is applied to the heat exchanger. Thus, in this embodiment, even if a large number of batteries B constituting the battery pack are placed, it is also possible to provide a heat exchanger in which the heat exchange flow passages are not collapsed.

Further, in the heat exchanger of this embodiment, since the position of the inner fin 2 can be regulated by the headers 3 and 3, it is possible to prevent swinging or rattling of the inner fin 2 due to the flow of the heat exchanging medium, which in turn can prevent stagnation of the heat exchange medium generated by the movements of the inner fin 2. Therefore, the fluidity of the heat exchange medium can be improved, so that the heat exchanging performance can be further enhanced.

Further, according to the heat exchanger of this embodiment, the tray member 10, the cover member 15, the inner fin 2, and the headers 3 as constituent members are made based on a synthetic resin, and therefore it can be easily produced only by appropriately heat-fusing the constituent members. Therefore, the heat exchanger of this embodiment can reduce the cost and improve the productivity, as compared with a conventional metal heat exchanger produced by troublesome bonding processing with high difficulty such as brazing.

Further, the heat exchanger of this embodiment, unlike the case of using troublesome and restricted metal processing, such as, e.g., metal plastic working and cutting, it is possible to further improve the production efficiency and reduce the cost.

Further, since the heat exchanger of this embodiment is formed by bonding the tray member 10 and the cover member 15 formed of a thin laminate sheet (laminate material) L1, it is possible to assuredly achieve sufficient thinning and sufficient weight reduction.

Further, in the heat exchanger of this embodiment, the outer packaging body 1 is formed of the laminate material L1. The shape and size of the heat exchanger itself can be easily changed. Further, since the thickness, the strength, the heat exchanging performance, and the like, can be easily changed as described above, it is possible to easily design an appropriate structure in accordance with the heat exchanger mounting position and the like. Therefore, the degree of flexibility in designing can be increased, and the versatility can also be improved.

Second Embodiment

Figures 10A, 10B, 10C:
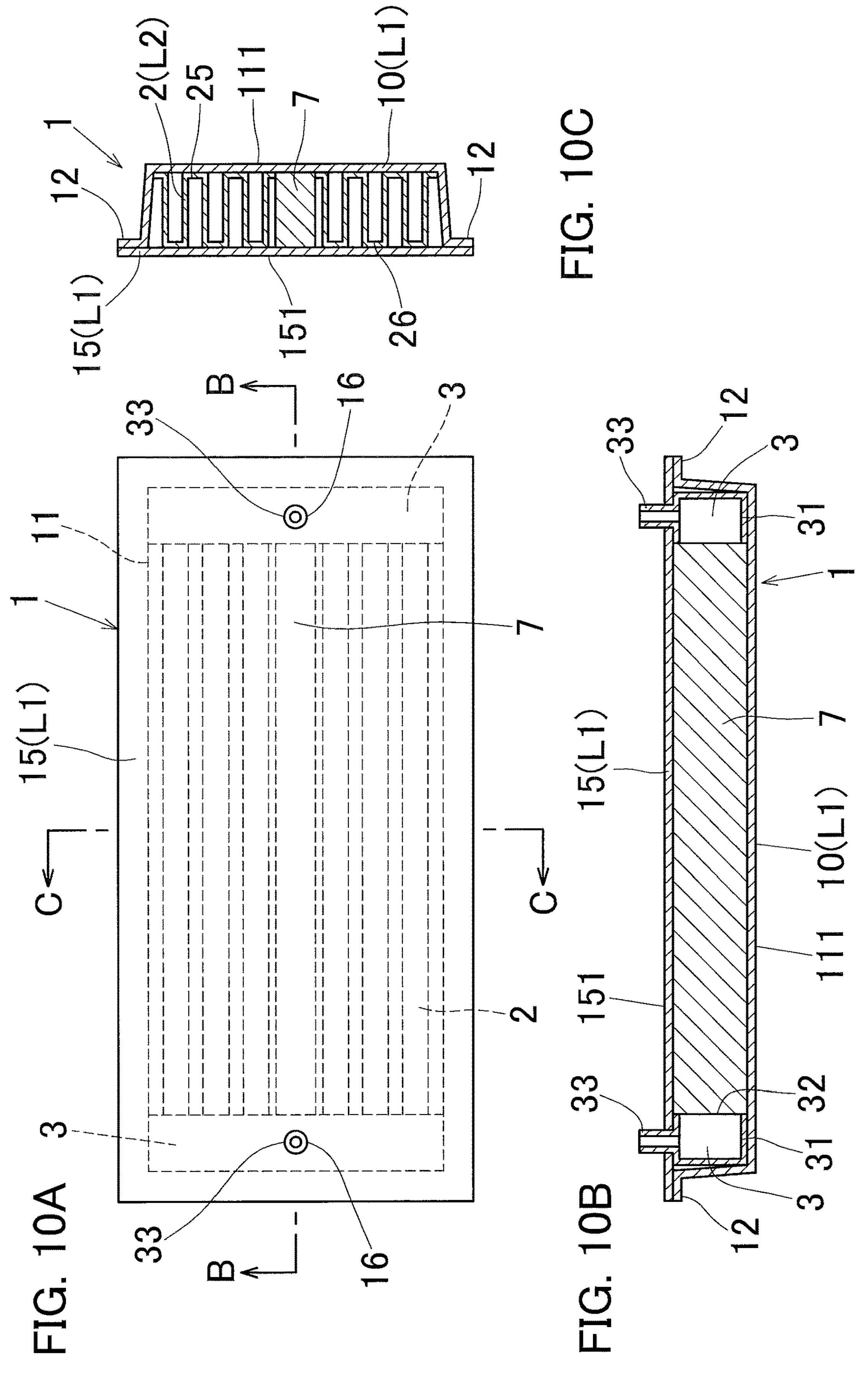
FIGS. 10A to 10C are diagrams showing a heat exchanger of a second embodiment.

FIGS. 10A to 10C are diagrams showing a heat exchanger of a second embodiment, FIG. 10A is a plan view thereof. FIG. 10B is a side cross-sectional view corresponding to the line B-B cross-section of FIG. 10A. FIG. 10C is a front cross-sectional view corresponding to the line C-C cross-section of FIG. 10A.

As shown in FIGS. 10A to 10C, the heat exchanger of the second embodiment is provided with an outer packaging body 1, two inner fins (inner core materials) 2 and 2 housed in the outer packaging body 1, a pair of headers (joint members) 3 and 3 accommodated in both end portions of the outer packaging body 1, a resin block 7 disposed in parallel to the extending direction of the concave/convex portions of the inner fin 2 at the intermediate portion in the width-direction (at a position between the two inner fins 2 and 2).

In the same manner as in the first embodiment, the outer packaging body 1 of the second embodiment is composed of a tray member 10 having a rectangular shape in a plan view and a cover member 15 having a rectangular shape in a plan view. The tray member 10 and the cover member 15 are also composed of an outer packaging laminate material L1, which is a laminate sheet having bendability or flexibility, like the first embodiment.

The outer packaging laminate material L1 of the second embodiment is also composed of a heat transfer layer 51, a heat-fusible layer 52, and a protective layer 53. The heat transfer layer is made of metal (metal foil). The heat-fusible layer 52 is formed of a heat-fusible resin film or a heat-fusible resin sheet and is laminated on one surface (inner surface) of the heat transfer layer 51 via an adhesive agent. The protective layer 53 is formed of a heat resistant resin film or a heat resistant resin sheet and is laminated on the other surface (outer surface) of the heat transfer layer 51.

Note that also in the second embodiment, the term "foil" is used to include the meaning of a film, a thin plate, and a sheet.

As the heat transfer layer 51 of the second embodiment, it is preferable to use a heat transfer layer having a thickness of 30 μm to 300 μm.

The outer packaging laminate material L1 of the second embodiment is the same as that of the first embodiment except that the heat transfer layer 51 having the above-mentioned thickness is used.

Since the other configurations of the outer packaging body 1 in the second embodiment are substantially the same as those of the first embodiment, the same or corresponding portion is denoted by the same reference numeral, and duplicate descriptions thereof will be omitted.

Two inner fins 2 are accommodated in the outer packaging body 1 of the second embodiment.

The inner fin 2 of the second embodiment is also constituted by an inner core laminate material L2, which is a laminate sheet having flexibility or bendability.

Further, the inner core laminate material L2 of the second embodiment also is composed of a heat transfer layer 61 formed of a metal foil, and heat-fusible layers 62 and 62 formed of a resin film or a resin sheet laminated on both surfaces of the heat transfer layer 61 via an adhesive agent.

As the heat transfer layer 61, a copper foil and an aluminum foil can be suitably used. As for the thickness, it is preferable to use a heat transfer layer having a thickness of 30 μm to 300 μm.

As the heat-fusible layer 62, the same heat-fusible layer as that of the first embodiment is used.

As the method of forming the concave and convex portions in the inner core laminate material L2, a method can be adopted in which the inner core laminate material L2 is passed between a pair of embossing rolls or a pair of corrugating rolls while being sandwiched therebetween to form the concave and convex portions in the inner core laminate material L2. Alternatively, a method can be adopted in which the concave and convex portions is formed in the inner core laminate material L2 with a press machine or a press mold.

Since the other configurations of the inner fin 2 in the second embodiment are substantially the same as those of the first embodiment, the same or corresponding portion is denoted by the same reference numeral, and duplicate descriptions thereof will be omitted.

A pair of headers 3 and 3 is arranged at both ends of the outer packaging body 1.

The header 3 of the second embodiment is also configured by a molded article of a synthetic resin. As the resin, the same resin as that of the first embodiment can be used.

As the method for producing a header 3 of the second embodiment, a method using an injection molding or the like can be adopted.

Since the other configurations of the header 3 in the second embodiment are substantially the same as that of the first embodiment, the same or corresponding portion is denoted by the same reference numeral, and duplicate descriptions thereof will be omitted.

As shown in FIGS. 10A to 10C, a resin block 7 is disposed inside the outer packaging body 1.

The resin block 7 functions as a reinforcing member against external pressure and internal pressure.

As the resin constituting the resin block 7, polyethylene, a polypropylene-based resin or a modified resin thereof, fluorine-based resin, a polyester-based resin, a vinyl chloride resin, or the like, is preferably used. Among them, polypropylene block copolymer is preferably used.

As the resin block 7, it is preferable to use a resin block made of the same kind of resin as the resin constituting the heat-fusible layer 52 of the outer packaging laminate material L1. By using the same kind of resin, the resin block 7 and the outer packaging body 1 can be securely fixed to each other with satisfactory mounting strength.

As for the hardness of the resin block 7, it is preferable to use a resin block having tensile strength of 0.3 $Kgf/mm^2$ to 10 $Kgf/mm^2$. The tensile strength is measured in accordance with JIS K 7127.

In the second embodiment, the resin block 7 is arranged at the central portion in the width direction of the heat exchanger in parallel to the extending direction of the concave and convex portions 25 and 26 of the inner fin 2. As shown in FIGS. 10A and 10C, in the second embodiment, since the resin block 7 is sandwiched by and between the inner fins 2 on both sides, two inner fins 2 are required.

As described above, the resin block 7 is arranged at the central portion in the widthwise direction of the heat exchanger, i.e., arranged so as to be sandwiched by the two inner fins 2. Therefore, even if strong external pressure is applied, the pressure is applied to the resin block 7. Therefore, it is possible to prevent the inner fin 2 from being deformed to inhibit the flow of the heat exchange medium.

Further, the resin block 7 is arranged parallel to the extending direction of the concave portion 25 and the convex portion 26 of the inner fin 2. Therefore, it is possible to cool the cooling target member (heat exchange target member) without blocking the flow of the heat exchange medium.

Note that although the resin block 7 of the second embodiment is disposed only at the central portion in the widthwise direction of the heat exchanger, an additional resin block 7 may be arranged at a position other than the central portion in cases where the heat exchanger requires further reinforcement.

The resin block 7 of the second embodiment is formed in a rectangular parallelepiped shape by an injection molding or cutting a resin plate or the like. The length in the front-back direction is the same as that of the inner fin 2, and the widthwise length is equal to or less than half the widthwise length of the inner fin 2.

The height of the resin block 7 of the second embodiment is configured to be the same as the height of the concave portion 25 and the convex portion 26 of the inner fin 2. As described above, since the height of the resin block 7 is set to be the same as the height of the concave portion 25 and the convex portion 26 of the inner fin 2, it is possible to improve the smoothness of the surface of the heat exchanger. This improves the adhesive properties with the electronic device or the like, which in turn can improve the heat exchange function.

The resin block 7 of the second embodiment is integrally bonded to the heat-fusible layers 52 of the tray member 10 and the cover member 15 by heat-fusion (heat bonding). The resin block 7 is not always required to be entirely made of resin. It is sufficient that at least the surfaces to be bonded to the heat-fusible layer 52 of the tray member 10 and the cover member 15 are made of resin.

In the second embodiment, the bonding between the resin block 7 and the heat-fusible layers 52 of the tray member 10 and the cover member 15 is performed by heat-fusing, but not limited only to bonding by heat-fusing. For example, an adhesive agent or an adhesive tape containing a modified polyolefin-based, acrylic-based, or epoxy-based adhesive agent or the like, may be used for bonding.

As described above, according to the heat exchanger of the second embodiment, the resin block 7 is fixed to the heat-fusible layer 52 of the outer packaging laminate material L1 (the tray member 10 and the cover member 15) by heat-fusing. Therefore, it is possible to prevent deformation of the heat exchanger even in cases where strong external pressure is applied. Further, as the resin block 7, by using the same kind of resin as the resin constituting the heat-fusible layer 52 of the outer packaging laminate material L1 or a resin which can be strongly adhered, even in cases where internal pressure is generated in the heat exchanger, the outer packaging body 1 can be prevented from swelling. In addition, by setting the width of the resin block 7 to 1 mm or more, deformation at the time of heat-fusing can be prevented.

Also, in the heat exchanger of the second embodiment, the same effects as those of the first embodiment can be obtained.

Third Embodiment

Figure 11C:
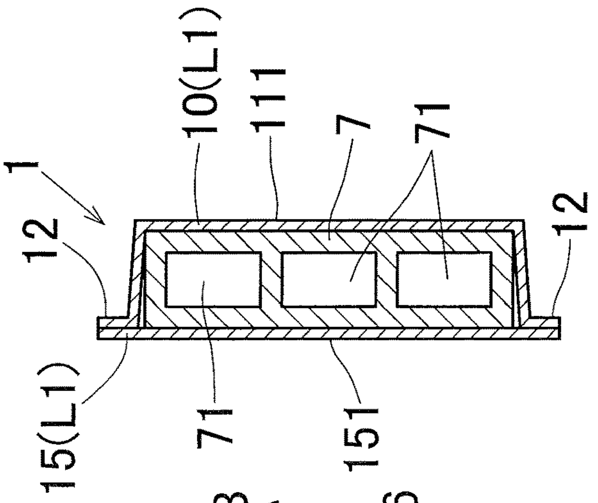
FIGS. 11A to 11C are diagrams showing a heat exchanger of a third embodiment.
Figure 11A:
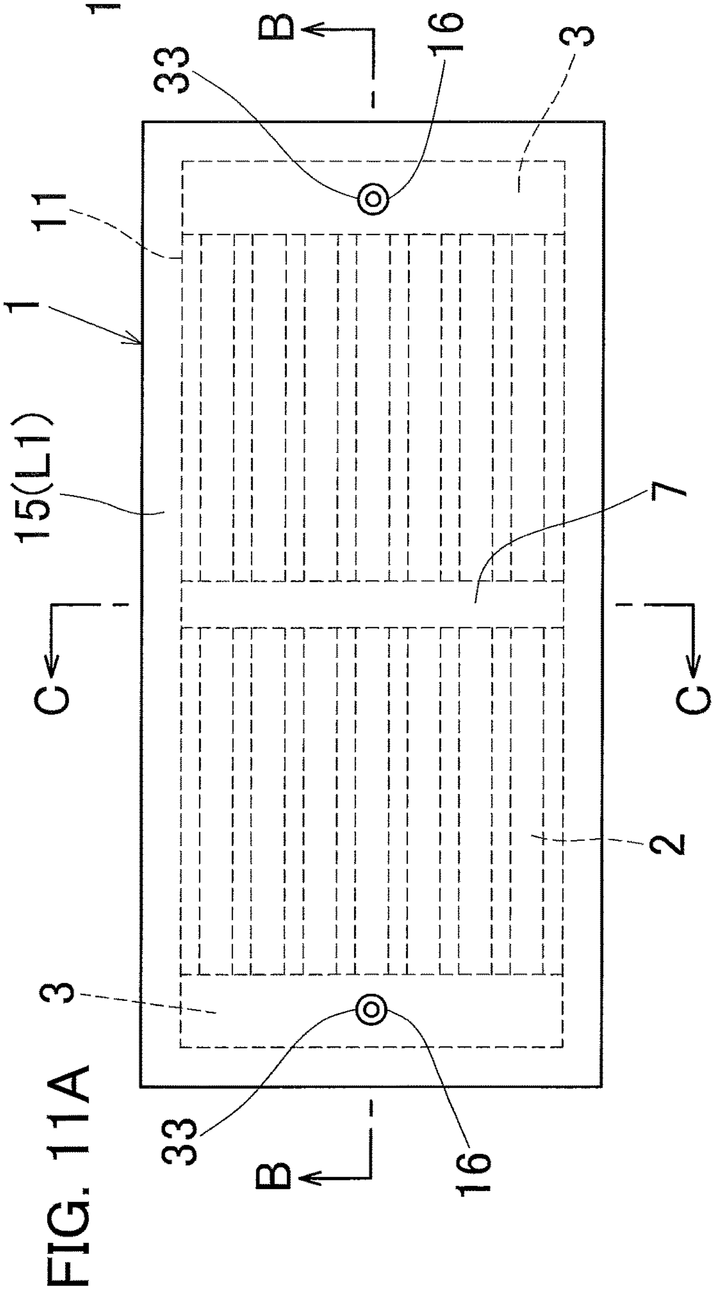
Figure 11B:
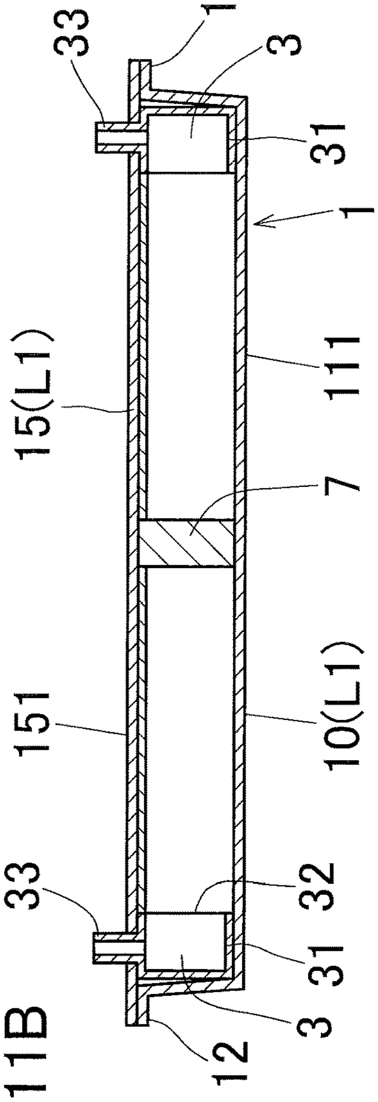

FIGS. 11A to 11C are diagrams showing a heat exchanger of a third embodiment. FIG. 11A is a plan view thereof. FIG. 11B is a side cross-sectional view corresponding to the line B-B cross-section of FIG. 11B. FIG. 11C is a front cross-sectional view corresponding to the line C-C cross-section of FIG. 11A.

In the third embodiment, a resin block 7 is arranged at the central portion (a position between the two inner fins 2) in the front-back direction of the heat exchanger perpendicular to the extending direction of the concave portion 25 and the convex portion 26 of the inner fin 2. As shown in FIG. 11A, also in the third embodiment, since the resin block 7 is sandwiched between front and rear inner fins 2, two inner fins 2 are required.

As shown in FIG. 11C, in the third embodiment, through-holes 71 are formed in the resin block 7.

In the third embodiment, the resin block 7 is arranged perpendicular to the extending direction of the concave portion 25 and the convex portion 26 of the inner fin 2, i.e., arranged to block the heat exchange flow passages. In order to ensure flow passages through which the heat exchange medium flows, through-holes 71 are formed in the resin block 7.

In FIG. 11C, when the surface area of the resin block 7 is S1 and the total surface area of the portions corresponding to the through-holes 71 is S2, it is preferable that S2 is set to 30% to 80% of the sum of S1 and S2 in the third embodiment.

Since the configuration other than the above-described heat exchanger of the third embodiment is substantially the same as that of the heat exchanger of the second embodiment, the same or corresponding portion is denoted by the same reference numeral, and duplicate descriptions will omitted.

According to the heat exchanger of the third embodiment as described above, since the through-holes 71 are formed in the resin block 7, it is possible to cool the cooling target member (heat exchange target member) without inhibiting the flows of the heat exchange medium.

Also, in the heat exchanger of the third embodiment, the same effects as those of the first and second embodiments can be obtained.

In the third embodiment, similarly to the second embodiment, in cases where further reinforcement of the heat exchanger is required, additional resin block 7 may be disposed at a position other than the center.

Modifications

Figure 6A:
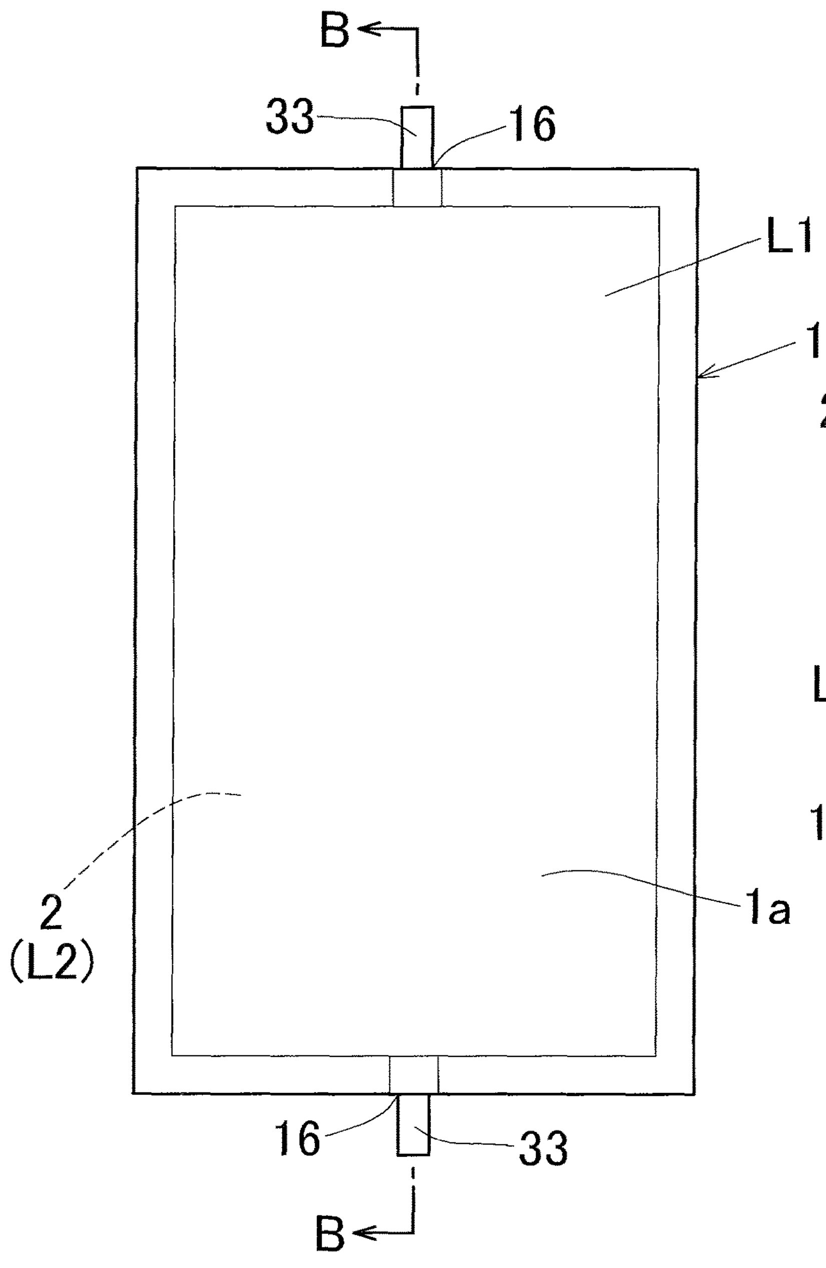
FIGS. 6A and 6B are diagrams showing a heat exchanger according to a modification of the present invention.
Figure 6B:
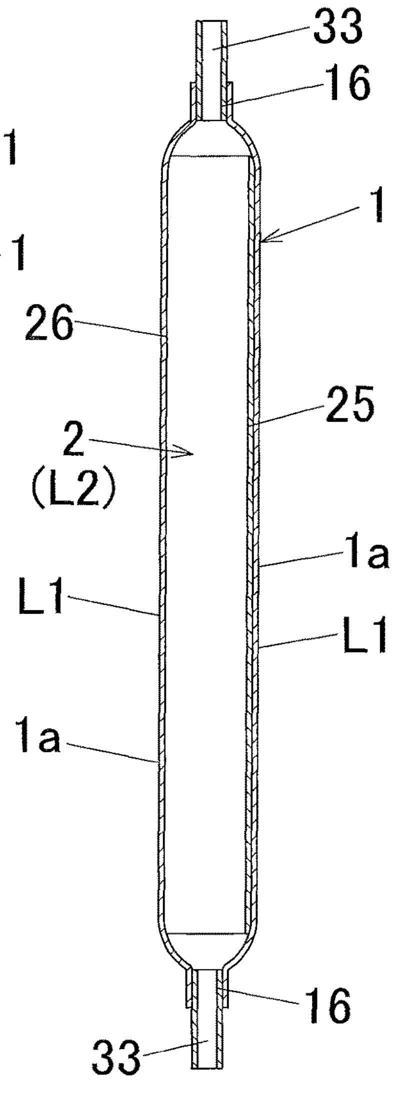

FIGS. 6A and 6B are diagrams showing a heat exchanger of a modification of the present invention. FIG. 6A is a plan view thereof. FIG. 6B is a side cross-sectional view thereof.

As shown in FIGS. 6A and 6B, the heat exchanger of this modification is provided with a bag-shaped outer packaging body 1 and an inner fin 2 disposed inside the outer packaging body 1. An inlet 16 and an outlet 16 are provided at the front and rear ends of the outer packaging body 1.

The outer packaging body 1 is formed of a pair of (two sheets of) outer packaging laminate materials L1 each composed of a sheet-like outer packaging body base material formed in a rectangular shape. The two pieces of the outer packaging laminate materials L1 are stacked via an inner fin 2. The heat-fusible layers 52 of the outer peripheral edge portions of the outer packaging laminate materials L1 are integrally bonded by heat-fusing (heat-sealing). Thus, the heat exchanger of this modification is formed.

In this modification, the inlet 16 and the outlet 16 in the outer packaging body 1 are each provided with a joint pipe 33. The joint pipe 33 is disposed so as to be sandwiched between the front end portion and the rear end portions of two sheets of outer packaging laminate materials 1*a* constituting the outer packaging body 1, and the outer peripheral surfaces (heat-fusible layer) of the respective joint pipes 33, 33 are integrally bonded to the heat-fusible layer 52 of the corresponding outer packaging laminate material L1 by heat-fusing. Thereby, the joint pipes 33 and 33 are fixed to the outer packaging body 1 in a state in which the inlet 16 and the outlet 16 of the outer packaging body 1 penetrate the front end portion and the rear end of the outer packaging body 1, respectively.

In the heat exchanger of this modification, the laminate material L1 constituting the outer packaging body 1 and the inner core laminate material L2 constituting the inner fin 2 are made of substantially the same material as the material of the laminate materials L1 and L2 of the embodiment shown in FIGS. 1 to 5. The inner fin 2 of this modification is formed in a rectangular wave shape in the same manner as in the above-described embodiments. The joint pipe 33 of this modification is made of the same material as the header 3 of the above-described embodiments.

In the heat exchanger of this modification, a pair of opposing walls 1*a* and 1*a* are formed by the opposing intermediate regions of the pair of outer packaging laminate materials L1, i.e., the installation region of the inner fin 2.

In this heat exchanger, a heat exchange medium, such as, e.g., a cooling fluid, is circulated in the outer packaging body 1 by introducing the cooling fluid from one of the joint pipes 33 and 33 to flow out of the other joint pipe 33 to perform heat-exchange between the circulating cooling fluid and the heat exchange target member in contact with the outer surface of the outer packaging body 1. Thus, the heat exchange target member is cooled.

Also, in this modification of the heat exchanger, it is possible to obtain the same effects as those of the heat exchanger of the above-described embodiments.

EXAMPLES

Example 1

(1) Preparation of Outer Packaging Laminate Material L1

An outer packaging laminate material L1 was prepared by bonding a linear low-density polyethylene (LLDPE) film having a thickness of 30 μm to one surface (inner surface) of an aluminum foil (having a thickness of 120 μm) containing 1.5% of Fe as a heat transfer layer 51 via a urethane-based adhesive agent (thickness: 3 μm) and bonding a polyethylene terephthalate (PET) having a thickness of 12 μm to the other surface (outer surface) of a heat transfer layer (aluminum foil) via a urethane-based adhesive agent (thickness: 3 μm).

(2) Preparation of Inner Core Laminate Material L2

An inner core laminate material L2 having a thickness of 0.2 mm was prepared by bonding a linear low-density polyethylene (LLDPE) film having a thickness of 40 μm to both sides of a soft aluminum foil (having a thickness of 120 μm) containing 1.0% of Fe and 0.18% of Si as a heat transfer layer 61 via a urethane-based adhesive agent (having a thickness of 3 μm).

(3) Preparation of Tray Member 10 and Cover Member 15

In accordance with the embodiment shown in FIGS. 1 to 3, the sheet material obtained by cutting the above-described outer packaging laminate material L1 was subjected to deep drawing using a press mold. Thus, a tray member 11 having a recessed portion 11 of a width of 60 mm×a length of 180 mm, a corner R of 0.2 mm, and a depth of 4 mm, and a flange portion 12 having a width of 10 mm formed on the entire circumference of the open edge portion of the recessed portion 11 was obtained.

The outer packaging laminate material L1 was cut to produce a sheet-like cover member 15 having a size (80 mm×200 mm) corresponding to the upper surface of the tray member 10, the cover member having an inlet/outlet 16 formed on both sides of the recessed portion 11 of the tray member 10.

(4) Preparation of Inner Fin 2

The above-described inner core laminate material L2 was formed by a gear embossing device into an inner fin 2 of a rectangular wave shape having, as shown in FIG. 5, a fin height Hf of 4 mm, a fin pitch Pf of 7.6 mm, a fin thickness Tf of 0.2 mm, a concave bottom wall width W11 of 4 mm, a convex top wall width W12 of 4 mm, an outer corner radius R1 of 0.3 mm, and an inner corner radius R2 of 0.1 mm. The rectangular wave shaped sheet was cut to a length of 120 mm×a width of 60 mm. The extending directions of the ridge and the direction of the valley of the inner fin 2 were arranged along the longitudinal direction.

(5) Production of Header 3

As shown in FIGS. 2 and 3, by injection molding a resin material made of HDPE, a header 3 was produced in which a pipe portion 33 of an inner diameter φ of 10 mm, an outer diameter φ of 12 mm, and a length of 3 mm was integrally formed on a mounting box portion 31 of a height of 4 mm×a length of 60 mm×a width of 30 mm.

(6) Assembly of Heat Exchanger

The headers 3 and 3 were accommodated at both ends of the recessed portion 11 of the tray member 10 with the pipe portions 33 facing upward. Further, the above-described inner fin 2 was accommodated between the headers 3 and 3 in the recessed portion 11.

Next, the cover member 15 was placed on the tray member 10 to close the recessed portion 11 from above. At this time, the pipe portions 33 and 33 of the headers 3 and 3 were inserted into the inlet 16 and the outlet 16 of the cover member 15 to be projected above the cover member 15.

Thus, a heat exchanger preassembled product in a non-bonded state was prepared. The preassembled product was subjected to heat-sealing (heat-bonding) of 200° C.×6 seconds bonding with upper and lower sealing dies conforming to the shape of the preassembled product to thermal weld (heat bond) the junction between the components in the preassembled product. Thus, a heat exchanger of Example 1 was prepared.

Example 2

As the inner fin 2, an inner fin of a rectangular wave shape was used in which a fin height Hf was 4 mm, a fin pitch Pf was 4 mm, a fin thickness Tf was 0.2 mm, a concave bottom wall width W11 was 2.2 mm, a convex top wall width W12 was 2.2 mm, an outer corner radius R1 was 0.5 mm, and an inner corner radius R2 was 0.3 mm. Except for the above, a heat exchanger of Example 2 was produced in the same manner as the embodiment described above.

Example 3

As the inner fin 2, an inner fin having a rectangular wave shape was used in which a fin height Hf was 4 mm, a fin pitch Pf was 12 mm, a fin thickness Tf was 0.2 mm, a concave bottom wall width W11 was 7.2 mm, a convex top wall width W12 was 5.2 mm, an outer corner radius R1 was 1 mm, and an inner corner radius R2 was 0.8 mm. Except for the above, a heat exchanger of Example 3 was produced in the same manner as the embodiment described above.

In the heat exchanger of a width of 60 mm×a length of 180 mm of the above-described Examples 1 to 3, in the case of placing a battery B having a width of 20 mm in the front-back direction and a weight of 2 kg per piece as shown in FIG. 9 within a range of the width of 120 mm in the front-back direction in the upper surface of the cover member 15, six batteries B can be placed. The heat exchanger can withstand a load of 12 kg. Note that the heat exchanger of Examples 1 to 3 can withstand a load of about 50 kg to about 60 kg.

Example 4

(1) Preparation of Outer Packaging Laminate Material L1

A non-stretched polypropylene (CPP) film having a thickness of 40 μm was bonded to one surface (inner surface) of an aluminum foil (having a thickness of 120 μm) containing 1.5% of Fe as a heat transfer layer 51 via a urethane-based adhesive agent (thickness of 3 μm). A polyethylene terephthalate (PET) film having a thickness of 12 μm was bonded to the other surface (outer surface) of the heat transfer layer (aluminum foil) via a urethane-based adhesive agent (thickness of 3 μm). Thus, an exterior laminate material L1 was prepared.

(2) Preparation Inner Core Laminate Material L2

A non-stretched polypropylene (CPP) film having a thickness of 30 μm was bonded to both sides of a soft aluminum foil (having a thickness of 120 μm) containing 1.0% of Fe and 0.18% of Si as a heat transfer layer 61 via a urethane-based adhesive agent (having a thickness of 3 μm). Thus, an inner core laminate material L2 having a thickness of 0.2 mm was prepared.

(3) Preparation of Tray Member 10 and Cover Member 15

In conformity to the second embodiment, a sheet material obtained by cutting the outer packaging laminate material L1 was subjected to deep drawing using a press mold to produce a tray member 10 provided with a recessed portion 11 having a width of 65 mm×a length of 180 mm, a corner R of 0.2 mm, and a depth of 4 mm, and a flange portion 12 having a width of 10 mm formed on the entire circumference of the opening edge portion of the recessed portion 11.

The above-described outer packaging laminate material L1 was cut to produce a sheet-like cover member 15 having a size (85 mm×200 mm) corresponding to the upper surface of the tray member 10, the cover member 15 having a inlet 16 and an outlet 16 formed on both sides of the recessed portion 11 of the tray member 10.

(4) Preparation of Inner Fin 2

The above-described inner core laminate material L2 was subjected to corrugate processing into, as shown in FIG. 5, a rectangular wave shape having a fin height Hf of 4 mm, a fin pitch Pf of 7.6 mm, a fin thickness Tf of 0.2 mm, a concave bottom wall width W11 of 4 mm, a convex top wall width W12 of 4 mm, an outer corner radius R1 of 0.3 mm, the inner corner radius R2 of 0.1 mm. The rectangular wave sheet was cut to a length of 120 mm×a width of 30 mm to produce two inner fins 2. The extending directions of the ridge and the valley of the inner fin 2 were arranged along the front-back direction.

(5) Production Header 3

As shown in FIGS. 2 and 3, a header 3 in which a pipe portion 33 having an inner diameter φ of 10 mm, an outer diameter φ of 12 mm, and a length of 3 mm was integrally formed on a mounting box portion 31 having a height of 4 mm, a length of 65 mm, and a width of 30 mm was produced by injection molding a polypropylene resin material.

(6) Production of Resin Block 7

A resin block 7 having a width of 5 mm×a length of 120 mm was produced by cutting a polypropylene plate having a thickness of 4 mm.

(7) Assemble of Heat Exchanger

As shown in FIGS. 10*a* to 10C, the header 3 with a polypropylene joint pipe was accommodated at both ends of the recessed portion 11 of the tray member 10 with the pipe portion 33 facing upward. Two pieces of the above-described inner fins 2 were accommodated between the headers 3 and 3 in the recessed portion 11, and the resin block 7 made of polypropylene was accommodated between the inner fins 2 in parallel to the extending direction of the concave portion 25 and that of the convex portion 26 of the inner fin 2.

Next, the cover member 15 was placed on the tray member 10 so as to close the recessed portion 11 from above. At this time, the pipe portions 33 and 33 of the headers 3 and 3 were inserted into the corresponding inlet/outlets 16 and 16 of the cover member 15 so as to be projected above the cover member 15.

Thus, a heat exchanger preassembled product in a non-bonded state was produced. By using upper and lower metal seal molds, each conforming to the shape of the preassembled product (with no thermally conductive rubber) for the above-described preassembled product, two stages of heat-fusing (heat bonding) was performed.

First, heat sealing (fusing process) for 190° C.×0.3 MPa×7 seconds was performed to heat-fuse (heat bond) the heat fusion layer 52 of the flange portion 12 of the tray member 10 and the heat fusion layer 52 of the outer peripheral edge portion of the cover member 15.

Subsequently, heat sealing (heat bonding) for 200° C.×0.3 MPa×7 seconds was performed to thermal weld (heat bond) the junctions of the outer packaging body 1, the inner fin 2, the headers 3, and the resin blocks 7. Thus, a heat exchanger of Example 4 was prepared.

Example 5

(1) Preparation of Outer Packaging Laminate Material L1

An outer packaging laminate material L1 was prepared in the same manner as in Example 4.

(2) Preparation of Inner Core Laminate Material L2

An inner core laminate material L2 was prepared in the same manner as in Example 4.

(3) Preparation of Tray Member 10 and Cover Member 15

A tray member 10 and a cover member 15 were prepared in the same manner as in Example 4.

(4) Preparation of Inner Fin 2

The above-described inner core laminate material L2 was subjected to corrugate processing to form a rectangular wave shape having a fin height Hf of 4 mm, a fin pitch Pf of 7.6 mm, a fin thickness Tf of 0.2 mm, a concave bottom wall width W11 of 4 mm, a convex top wall width W12 of 4 mm, an outer corner radius R1 of 0.3 mm, and an inner corner radius R2 of 0.1 mm. The rectangular wave sheet was cut to a length of 57.5 mm and a width of 65 mm to produce two inner fins 2. Note that the direction of the peak and the direction of the valley of inner fin 2 are arranged along the front-back direction.

(5) Production of Header 3

Headers 3 were produced in the same manner as in Example 4.

(6) Preparation of Resin Block 7

A polypropylene plate having a thickness of 4 mm was cut to produce a resin block 7 having a width of 65 mm×a length of 5 mm. A through-hole 71 having a width of 5 mm×a height of 2 mm was opened at intervals of 12 mm pitch in the body portion of the resin block 7 (the plane intersecting the heat exchange flow passage).

(7) Assemble of Heat Exchanger

As shown in FIGS. 11A to 11C, the headers 3 and 3 each having a polypropylene joint pipe were accommodated at both ends of the recessed portion 11 of the tray member 10 with the pipe portion 33 facing upward. Two pieces of the above-described inner fins 2 were accommodated between the headers 3 and 3 in the recessed portion 11. The resin block 7 made of polypropylene was accommodated between the inner fins 2 so as to be perpendicular to the extending direction of the concave portion 25 and that of the convex portion 26 of the inner fin 2.

Next, the cover member 15 was placed on the tray member 10 so as to close the recessed portion 11 from above. At this time, the pipe portions 33 and 33 of the headers 3 and 3 were inserted into the corresponding inlet 16 and outlet 16 of the cover member 15 so as to be projected above the cover member 15.

Thus, a heat exchanger preassembled product in a non-bonded state was produced. Using the upper and lower metal seal mold (with no thermally conductive rubber) conforming to the shape of the preassembled product with respect to the preassembled product, the preassembled product was subjected to two stages of heat-fusing (heat bonding) in the same manner as in Example 4. Thus, a heat exchanger of Example 5 was produced.

Comparative Example 1

Figure 7:
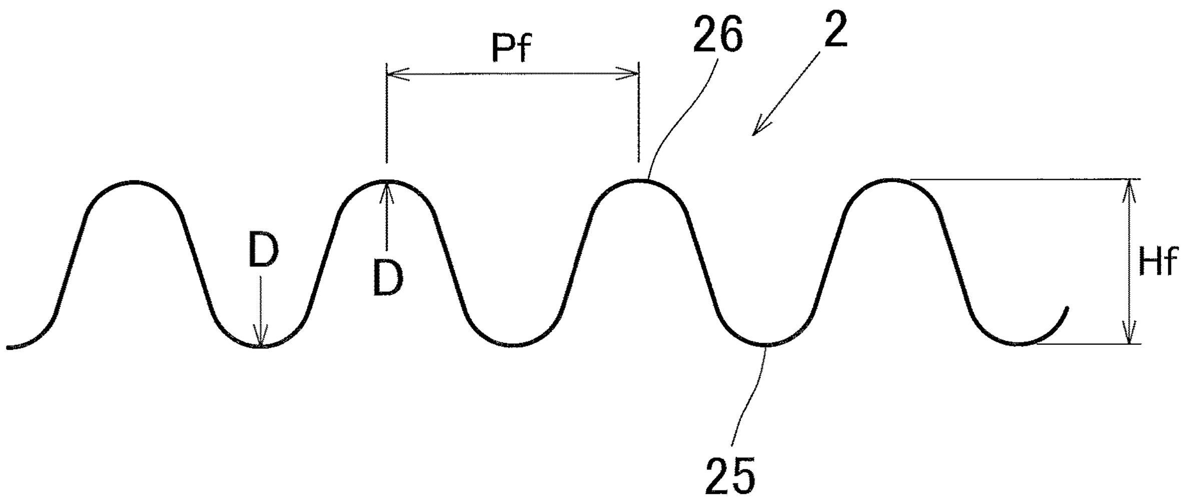
FIG. 7 is a front cross-sectional view for explaining an inner fin applied to a heat exchanger of Comparative Example 1.

As an inner fin as shown in FIG. 7, a wavy shaped inner fin in which a concave portion and a convex portion each having a fin height Hf of 4 mm, a fin pitch Pf of 7.6 mm, a fin thickness Tf of 0.2 mm, an inner surface side radius D of 3.5 mm were continuously formed was used. Except for that, a heat exchanger of Comparative Example 1 was prepared in the same manner as in the above-described Example 1.

Comparative Example 2

Figure 8:
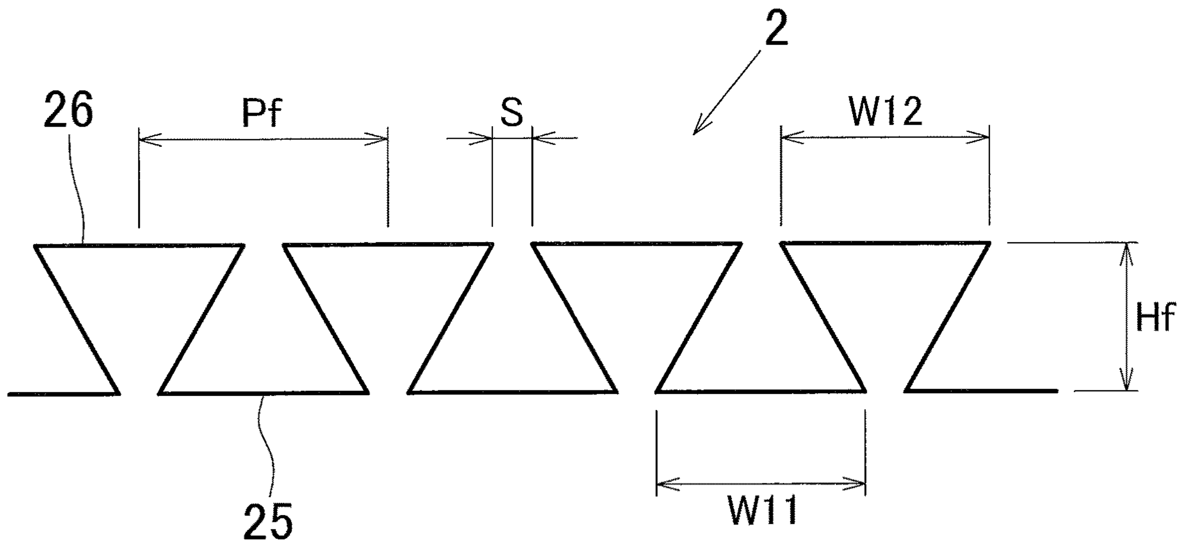
FIG. 8 is a front cross-sectional view for explaining an inner fin applied to a heat exchanger of Comparative Example 2.

As shown in FIG. 8, an inner fin 2 was prepared as an inner fin in which a triangular shape and an inversed triangular shape were arranged alternately and continuously. That is, a heat exchanger of Comparative Example 2 was produced in the same manner as Example 1 except that an inner fin having a fin height Hf of 4 mm, a fin pitch Pf of 7.6 mm, a fin thickness Tf of 0.2 mm, a concave bottom wall width W11 of 6.0 mm, a convex top wall width W12 of 6.0 mm, and a gap between adjacent convex top walls (a gap between adjacent concave bottom walls) S of 1.6 mm was used.

Comparative Example 3

(1) Preparation of Outer Packaging Laminate Material L1

An outer packaging laminate material L1 was prepared in the same manner as in Example 4.

(2) Preparation of Inner Core Laminate Material L2

An inner core laminate material L2 was prepared in the same manner as in Example 4.

(3) Preparation of Tray Member 10 and Cover Member 15

A tray member 10 and a cover member 15 were prepared in the same manner as in Example 4.

(4) Preparation of Inner Fin 2

The inner core laminate material L2 was subjected to corrugate processing to form a rectangular wave shape having a fin height Hf of 4 mm, a fin pitch Pf of 7.6 mm, a fin thickness Tf of 0.2 mm, a concave bottom wall width W11 of 4 mm, a convex top wall width W12 of 4 mm, an outer corner radius R1 of 0.3 mm, and an inner corner radius R2 of 0.1 mm. The rectangular wave sheet was cut to a length of 120 mm and a width of 65 mm to produce an inner fin 2. Note that the direction of the peak and the direction of the valley of the inner fin 2 were arranged along the front-back direction.

(5) Production of Header 3

A header 3 was generated in the same manner as in Example 4.

(6) Assembly of Heat Exchanger

The header 3 with a polypropylene joint pipe was accommodated at both ends of recessed portion 11 of the tray member 10 with the pipe portion 33 facing upward. Further, the above-described inner fin 2 was accommodated between the headers 3 and 3 in the recessed portion 11.

Next, the cover member 15 was placed on the tray member 10 so as to close the recessed portion 11 from above. At this time, the pipe portions 33 of the headers 3 were inserted into the inlet 16 and the outlet 16 of the header 3 so as to protrude above the cover member 15.

Thus, a preassembled exchanger product in a non-bonded state was prepared. Using upper and lower metal seal molds conforming to the shape of the preassembled product (with no thermally conductive rubber) for the preassembled product, two stages of thermal welding (heat bonding) were performed.

First, heat sealing (fuse processing) of 190° C.×0.3 MPa×7 seconds was performed to thermal weld (heat bond) the heat-fusible layer 52 of the flange portion 12 of the tray member 10 and the heat-fusible layer 52 of the outer peripheral edge portion of the cover member 15.

Subsequently, heat-sealing (heat-bonding process) of 200° C.×0.3 MPa×7 seconds was performed to thermal weld (heat bond) the junctions of the outer packaging body 1, the inner fin 2, and the headers 3. Thus, a heat exchanger of Comparative Example 3 was prepared.

<Internal Pressure Test>

TABLE 1

| | Internal Pressure Resistance Test | External Pressure Resistance Test |
|---|---|---|
| Example 1 | ○ | ○ |
| Example 2 | ○ | ○ |

TABLE 1-continued

| | Internal Pressure Resistance Test | External Pressure Resistance Test |
|---|---|---|
| Example 3 | ○ | ○ |
| Comparative Example 1 | Δ | Δ |
| Comparative Example 2 | ○ | X |

Twenty heat exchangers of Examples 1 to 3 and twenty Comparative Examples 1 and 2 were prepared. For each heat exchanger, tap water was continuously flowed (circulated) for 336 hours (14 days) at a flow water pressure of 0.2 MPa. It was evaluated whether or not peeling occurred at any location of each heat exchanger.

Specifically, those with 1 or less peels between the outer packaging body 1 and the inner fin 2 out of twenty heat exchanges were evaluated as passed "Δ", and those with 2 or more peels between the outer packaging body 1 and the inner fin 2 out of twenty heat exchangers were evaluated as failed "X". Among the passed products, those that did not cause peeling at all were evaluated to be extremely good "○". The results are shown in Table 1.

<External Pressure Test>

The collapse degree was evaluated by applying a 500 kg load with a 50 mm×50 mm plane mold at a position except for the headers 3 in the outer packaging body 1.

Specifically, those with a collapse height (quantity) of less than 0.5 mm were evaluated as passed "Δ", and those with a collapse height of 1 mm or more were evaluated as failed "X". Among the passed products, those that did not cause collapse at all (those with a collapse height of "○") were evaluated as extremely good "○". The results are also shown in Table 1.

As is clear from Table 1, excellent evaluations were obtained for both the internal pressure and the external pressure in the heat exchanger of Examples 1 to 3 with a rectangular inner fin 2. In contrast, in the heat exchangers provided with the inner fins of Comparative Examples 1 and 2 having an arc-shape or a triangular shape, as compared with the heat exchanges of Examples 1 to 3, it can be seen that they are somewhat inferior in both the internal pressure and the external pressure.

TABLE 2

| | Component | Resin block orientation | Internal pressure resistance test | External pressure Resistance test |
|---|---|---|---|---|
| Example 4 | Tray member<br>Cover member<br>Inner fin<br>Header<br>Resin block (with no through-hole) | Parallel to the extending direction of the concave and convex direction | ◎ | ◎ |
| Example 5 | Tray member<br>Cover member<br>Inner fin<br>Header<br>Resin block (with through-holes) | Perpendicular to the extending direction of the concave and convex portions of the inner fin | ◎ | ◎ |
| Comparative Example 3 | Tray member<br>Cover member<br>Inner fin<br>Header | — | ○ | X |

<Internal Pressure Test>

Three pieces of heat exchangers of Example 4 and 5 and Comparative Example 3 each composed of components shown in Table 2 were prepared. Cooling water was flows through each heat exchanger and held at the internal pressure of 1.5 MPa for 5 minutes, and the presence or absence of adhesive breakdown portion between the outer packaging body 1 and the inner fin 2 of each heat exchanger was observed. For reference, a test was also conducted when the internal pressure was excessively increased to 2 MPa.

These results were evaluated based on the internal pressure resistance test criteria below. The evaluation results are shown in Table 2.

<Evaluation Criteria for Internal Pressure Resistant Test>

"◎" (Excellent): No adhesive breakdown, such as, e.g., peeling and swelling, occurred up to the internal pressure of 2 MPa.

"○" (Passed): adhesive breakdown, such as, e.g., peeling and swelling, did not occur up to the internal pressure of 1.5 MPa, but adhesive breakdown, such as, e.g., peeling and swelling, occurred when the internal pressure exceeded 1.5 MPa.

"x" (Failed): adhesive breakdown, such as, e.g., peeling and swelling, occurred less than the internal pressure of 2 MPa.

<External Pressure Test>

Three heat exchangers of Examples 4 and 5 and Comparative Example 3 composed of the components shown in Table 2 were prepared. An aluminum plate having a thickness of 5 mm, a width of 65 mm, a length of 120 mm was pressed against both surfaces of each heat exchanger. One of the surfaces is placed on a concrete floor, and pressure of 5 MPa was applied from the other surface and held for one minute. The degree of deformation of each heat exchanger was confirmed. Note that both the outer height of each heat exchanger was 4.3 mm.

These results were evaluated based on the following external pressure test evaluation criteria. The evaluation results are shown in Table 2.

<Evaluation Criteria for External Pressure Test>

"◎" (Extremely Good): No deformation up to the external pressure of 5 MPa (no change in the heat exchanger height)

"○" (Passed): No deformation up to the external pressure of 4.5 MPa, but when the external pressure was equal to or less than 5 MPa, the height of the heat exchanger was reduced by 0.1 mm to 0.3 mm.

"x" (Failed): The height of the heat exchanger was reduced by 0.4 mm or more when the external pressure was less than 5 MPa.

As apparent from Table 2, in the heat exchangers of Example 4 and 5 with the resin block 7, it was possible to obtain excellent evaluations for both the internal pressure and the external pressure. In contrast, in the heat exchanger of Comparative Example 3 having no resin block 7, as compared with the heat exchangers of Examples 4 and 5, it can be seen that it is inferior in both the internal pressure and the external pressure.

INDUSTRIAL APPLICABILITY

The heat exchanger according to the present invention can be used as a heater (heating device) used for floor heating and snow removing, in addition to a cooler (cooling device) used mainly for countermeasures for heat generation around a battery for automobiles, and a CPU and a battery for smartphones and personal computers, countermeasures for heat generation around a liquid crystal TV, an organic EL TV, and a display for plasma TV, and countermeasures for heat generation around power module and batteries for automobiles.

This application claims priority to Japanese Patent Application No. 2019-234834 filed on Dec. 25, 2019 and Japanese Patent Application No. 2020-177751 filed on Oct. 23, 2020, the disclosures of which are incorporated herein by reference in their entirety.

The terms and expressions used herein are for illustration purposes only and are not used for limited interpretation, do not exclude any equivalents of the features shown and described herein, and it should be recognized that the present invention allows various modifications within the scope of the present invention as claimed.

DESCRIPTION OF SYMBOLS

1: Outer packaging body
1*a*: Pair of opposing walls
10: Tray member
11: Recessed portion
111: Bottom wall (opposing wall)
15: Cover member
151: Upper wall (opposing wall)
16: Inlet/outlet
2: Inner fin
25: Recessed portion
26: Convex portion
51: Heat transfer layer
52: Heat-fusible layer
61: Heat transfer layer
62: Heat-fusible layer
L1: Outer packaging laminate material
L2: Inner core laminate material
Hf: Fin height
Pf: Fin pitch
W11: Concave bottom surface width
W12: Convex top surface Width

The invention claimed is:

1. A heat exchanger comprising:

an outer packaging body including a tray member and a cover member, the tray member is integrally formed with a recessed portion and a flange projecting outward from an outer periphery of an opening edge of the recessed portion, the flange of the tray member and an outer peripheral edge of the cover member are heat-sealed, the outer packaging body is provided with an inlet, an outlet, and a pair of opposing walls, the pair of opposing walls being portions of the tray member and the cover member; and a corrugated inner fin disposed between the pair of opposing walls and provided with a concave portion and a convex portion alternately and continuously, wherein a heat exchange medium flows into an inner fin installation portion in the outer packaging body from the inlet, passes through the inner fin installation portion, and flows out of the outlet, wherein the outer packaging body including each of the tray member and the cover member is formed of an outer packaging laminate material in which a resin heat-fusible layer is laminated via a first adhesive agent on an inner surface side of a metal heat transfer layer, and a protective layer made of a heat resistant resin is laminated on an outer surface side of the metal heat transfer layer of the outer packaging body via the first adhesive agent, the heat resistant resin has a melting point higher than a melting point of a heat-fusible resin of the heat-fusible layer by 10° C. or more, the metal heat transfer layer of the outer packaging body is made of metal foil, the resin heat-fusible layer is composed of polyolefin resin, the protective layer is composed of polyester resin or polyamide resin, wherein the inner fin is formed of an inner core laminate material in which a heat-fusible layer is laminated on both surface sides of a metal heat transfer layer via a second adhesive agent, the metal heat transfer layer of the inner fin is made of metal foil, the heat-fusible layers of the inner fin are composed of polyolefin resin, wherein the inner fin is formed in a rectangular wave shape in which a concave bottom wall and a convex top wall are arranged parallel to the pair of opposing walls, and a rising wall connecting the concave bottom wall and the convex top wall is arranged perpendicular to the pair of opposing walls, and wherein the concave bottom wall and the convex top wall of the inner fin and the pair of opposing walls of the outer packaging body are thermal fusion bonded between the polyolefin resin of the heat-fusible layers of the inner fin and the polyolefin resin of the resin heat-fusible layer of the outer packaging body.

2. The heat exchanger as recited in claim 1, wherein when a width of the concave bottom wall of the inner fin is W11, and a width of the convex top wall is W12, the following relation is satisfied:

$$0.9 \leq W12/W11 \leq 1.1.$$

3. The heat exchanger as recited in claim 1, wherein when a fin pitch of the inner fin is Pf, and a fin height of the inner fin is Hf, the following relation is satisfied:

$$Pf/2 = 0.1Hf \text{ to } 10Hf.$$

4. The heat exchanger as recited in claim 1, wherein the recessed portion is formed in an intermediate region for accommodating the inner fin, and the cover member is arranged to close the recessed portion of the tray member.

5. The heat exchanger as recited in claim 1, wherein the outer packaging body is formed by integrally joining outer peripheral edge portions of two outer packaging laminate materials stacked via the inner fin.

6. The heat exchanger as recited in claim 2, wherein when a fin pitch of the inner fin is Pf, and a fin height of the inner fin is Hf, the following relation is satisfied:

$$Pf/2 = 0.1Hf \text{ to } 10Hf.$$

7. The heat exchanger as recited in claim 2, wherein the recessed portion is formed in an intermediate region for accommodating the inner fin, and the cover member is arranged to close the recessed portion of the tray member.

8. The heat exchanger as recited in claim 3, wherein the recessed portion is formed in an intermediate region for accommodating the inner fin, and the cover member is arranged to close the recessed portion of the tray member.

9. The heat exchanger as recited in claim 2, wherein the outer packaging body is formed by integrally joining outer peripheral edge portions of two outer packaging laminate materials stacked via the inner fin.

10. The heat exchanger as recited in claim 3, wherein the outer packaging body is formed by integrally joining outer peripheral edge portions of two outer packaging laminate materials stacked via the inner fin.

11. The heat exchanger as recited in claim 1, wherein the first adhesive agent is a urethane-based adhesive agent, an epoxy-based adhesive agent, or an olefin-based adhesive agent.

12. The heat exchanger as recited in claim 11, wherein the first adhesive agent has a thickness of 1 μm to 5 μm.

13. The heat exchanger as recited in claim 1, wherein the second adhesive agent is a urethane-based adhesive agent, an epoxy-based adhesive agent, or an olefin-based adhesive agent.

14. The heat exchanger as recited in claim 13, wherein the second adhesive agent has a thickness of 1 μm to 5 μm.

15. The heat exchanger as recited in claim 1, wherein the first adhesive agent and the second adhesive agent are each a urethane-based adhesive agent, an epoxy-based adhesive agent, or an olefin-based adhesive agent.

* * * * *